(12) United States Patent
Yun et al.

(10) Patent No.: US 9,490,130 B2
(45) Date of Patent: Nov. 8, 2016

(54) METHOD OF MANUFACTURING THREE-DIMENSIONAL SEMICONDUCTOR MEMORY DEVICE IN WHICH AN OXIDE LAYER IS FORMED AT BOTTOM OF VERTICAL STRUCTURE OF THE DEVICE

(71) Applicant: SAMSUNG ELECTRONICS CO., LTD., Suwon-Si, Gyeonggi-Do (KR)

(72) Inventors: Jong In Yun, Seoul (KR); Jin-Soo Lim, Yongin-si (KR); Hansoo Kim, Suwon-si (KR); Sung-Hwan Jang, Bucheon-si (KR); Youngwoo Park, Seoul (KR); Byoungkeun Son, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/726,648

(22) Filed: Jun. 1, 2015

(65) Prior Publication Data
US 2015/0262826 A1    Sep. 17, 2015

Related U.S. Application Data

(62) Division of application No. 13/193,702, filed on Jul. 29, 2011, now abandoned.

(30) Foreign Application Priority Data

Oct. 11, 2010 (KR) .................. 10-2010-0098962
Oct. 18, 2010 (KR) .................. 10-2010-0101514

(51) Int. Cl.
| | | |
|---|---|---|
| H01L 21/00 | (2006.01) | |
| H01L 21/84 | (2006.01) | |
| H01L 21/28 | (2006.01) | |
| H01L 27/115 | (2006.01) | |
| H01L 29/66 | (2006.01) | |
| H01L 29/792 | (2006.01) | |
| H01L 21/311 | (2006.01) | |

(52) U.S. Cl.
CPC .... *H01L 21/28282* (2013.01); *H01L 21/31111* (2013.01); *H01L 27/11568* (2013.01);
(Continued)

(58) Field of Classification Search
CPC .................. H01L 27/11578; H01L 29/7926; H01L 27/11582; H01L 29/792
USPC ....... 438/156, 268, 269, 270, 324, 479, 585, 438/591
See application file for complete search history.

(56) References Cited

U.S. PATENT DOCUMENTS

2003/0094635 A1   5/2003   Yaegashi
2008/0179659 A1   7/2008   Enda et al.
(Continued)

FOREIGN PATENT DOCUMENTS

JP   2009-266945   11/2009
JP   2009-277770   11/2009
(Continued)

*Primary Examiner* — David Chen
(74) *Attorney, Agent, or Firm* — Volentine & Whitt, PLLC

(57) ABSTRACT

A method of manufacturing a three-dimensional semiconductor memory device comprises forming a thin layer structure by alternately stacking first and second material layers on a substrate, forming a penetration dent penetrating the thin layer structure and exposing a top surface of the substrate recessed by the penetration dent, forming a vertical insulation layer penetrating the thin layer structure to cover an inner wall of the penetration dent, forming a semiconductor pattern penetrating the vertical insulation layer at the penetration dent to be inserted into the substrate, and forming an oxide layer between the thin layer structure and the substrate by oxidizing a sidewall of the penetration dent.

14 Claims, 39 Drawing Sheets

(52) U.S. Cl.
CPC ... *H01L27/11578* (2013.01); *H01L 27/11582* (2013.01); *H01L 29/66833* (2013.01); *H01L 29/7926* (2013.01)

(56) References Cited

U.S. PATENT DOCUMENTS

| | | | | |
|---|---|---|---|---|
| 2009/0121271 | A1* | 5/2009 | Son | H01L 21/8221 257/315 |
| 2009/0310425 | A1* | 12/2009 | Sim | H01L 27/11526 365/185.29 |
| 2010/0059811 | A1 | 3/2010 | Sekine et al. | |
| 2010/0078701 | A1 | 4/2010 | Shim et al. | |
| 2010/0140682 | A1 | 6/2010 | Kamioka et al. | |
| 2010/0213537 | A1* | 8/2010 | Fukuzumi | H01L 27/11578 257/326 |

FOREIGN PATENT DOCUMENTS

| | | |
|---|---|---|
| KR | 1020090125893 A | 12/2009 |
| KR | 1020100066783 A | 6/2010 |

\* cited by examiner

METHOD OF MANUFACTURING THREE-DIMENSIONAL SEMICONDUCTOR MEMORY DEVICE IN WHICH AN OXIDE LAYER IS FORMED AT BOTTOM OF VERTICAL STRUCTURE OF THE DEVICE

CROSS-REFERENCE TO RELATED APPLICATIONS

This application is a Divisional of U.S. application Ser. No. 13/193,702, filed Jul. 29, 2011, which claims priority under 35 U.S.C. §119 to Korean Patent Application No. 10-2010-0101514 filed on Oct. 18, 2010, and Korean Patent Application No. 10-2010-0098962 filed on Oct. 11, 2010, the respective disclosures of which are hereby incorporated by reference in their entirety.

BACKGROUND

Embodiments of the inventive concept relate generally to electronic memory technologies. More particularly, embodiments of the inventive concept relate to three-dimensional semiconductor memory devices and related methods of manufacture.

There is a continuing demand for semiconductor memory devices having faster performance and higher storage capacity. This demand places pressure on designers to increase the integration density of existing semiconductor memory devices.

In general, the integration density of a semiconductor device relates to the number of features that can fit within an area of the device. In planar devices, for instance, the integration density is limited by the degree of miniaturization of features, which depends on the capabilities of fine pattern forming technology. Unfortunately, such technology can be prohibitively expensive, so there are practical limits to the degree of miniaturization that can be achieved through miniaturization.

To overcome these limits, researchers have proposed semiconductor devices comprising memory cells arranged in three-dimensions. However, conventional three-dimensional semiconductor devices cannot be manufactured reliably or economically due to limits of current process technology.

SUMMARY

According to one embodiment of the inventive concept, a method of manufacturing a three-dimensional semiconductor memory device comprises forming a thin layer structure by alternately stacking first and second material layers on a substrate, forming a penetration dent penetrating the thin layer structure and exposing a top surface of the substrate recessed by the penetration dent, forming a vertical insulation layer penetrating the thin layer structure and covering an inner wall of the penetration dent, forming a semiconductor pattern penetrating the vertical insulation layer at the penetration dent and inserted into the substrate, and forming an oxide layer between the thin layer structure and the substrate by oxidizing a sidewall of the penetration dent.

According to another embodiment of the inventive concept, a three-dimensional semiconductor memory device comprises a substrate in which a penetration dent is formed, an electrode structure disposed on the substrate and comprising sequentially stacked electrodes, a vertical insulation layer penetrating the electrode structure and covering an inner wall of the penetration dent, a semiconductor pattern penetrating the vertical insulation layer and inserted into the substrate, and an oxide layer covering a sidewall of the penetration dent between the substrate and the electrode structure.

According to still another embodiment of the inventive concept, a three-dimensional semiconductor memory device comprises a substrate having a penetration dent and a plurality of impurity regions, an electrode structure formed on a substrate and comprising a plurality of sequentially stacked electrodes, a vertical insulation layer penetrating the electrode structure and covering an inner wall of the penetration dent to define a cylindrical boundary, a semiconductor body formed within the cylindrical boundary of the vertical insulation layer and entering the penetration dent, a semiconductor spacer formed between the semiconductor body and the vertical insulation layer, and an oxide layer covering sidewalls of the penetration dent between the semiconductor body and the impurity regions.

These and other embodiments can provide memory structures with improved mechanical stability and improved current flow.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the following description, technical terms are used to explain specific embodiments, but they should not be construed in a limiting sense. Terms in a singular form can encompass plural forms as well. Terms such as "include," "comprise," "including," and "comprising," indicate the presence of certain features, but they do not exclude additional features. Where a feature is referred to as being "on" another feature, it can be directly on the other feature or intervening features may also be present.

Certain embodiments will be described with reference to sectional views having idealized or exaggerated dimensions or shapes. These sectional views are not to be construed as limiting the described embodiments, but are merely presented in an effort to clearly describe certain features and concepts.

In general, the described embodiments relate to three-dimensional semiconductor memory devices and related methods of manufacture. In some embodiments, a three-dimensional semiconductor memory device comprises a cell array region, a peripheral circuit region, and a connection region. The cell array region comprises a plurality of memory cells, and a plurality of bit lines and word lines connected to the memory cells. The peripheral circuit region comprises peripheral circuits configured to drive the memory cells and to read data stored in the memory cells. As examples, the peripheral region can comprise a word line driver, a sense amplifier, row and column decoders, and control circuits. The connection region is disposed between the cell array region and the peripheral circuit region, and an interconnection structure electrically connects the word lines and the peripheral circuits.

Figure 1:
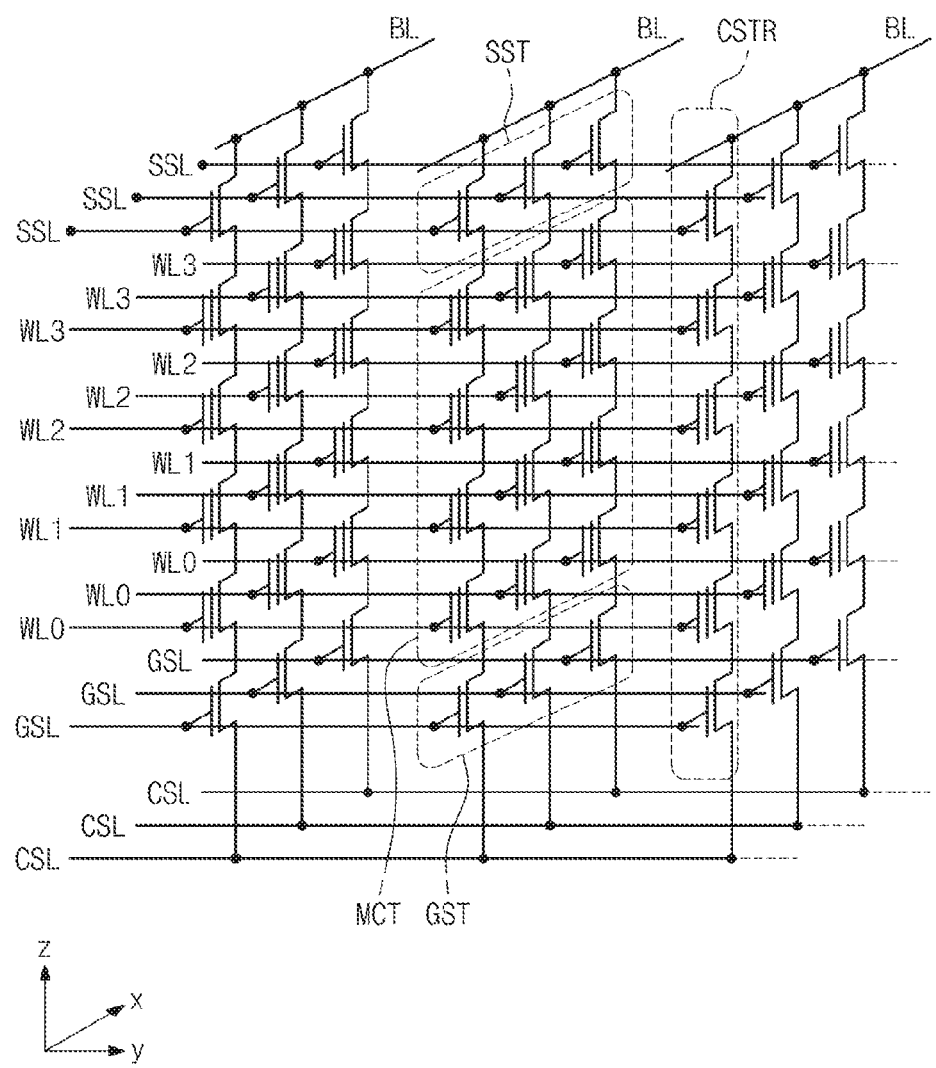
FIG. 1 is a circuit diagram illustrating a three-dimensional semiconductor memory device according to an embodiment of the inventive concept.

FIG. 1 is a circuit diagram illustrating cell arrays of a three-dimensional semiconductor memory device according to an embodiment of the inventive concept.

Referring to FIG. 1, the cell arrays comprise common source lines CSL, bit lines BL, and cell strings CSTR between common source lines CSL and bit lines BL.

Bit lines BL are arranged in a two-dimension plane, and cell strings CSTR are connected in parallel through bit lines BL. Cell strings CSTR are commonly connected to common source lines CSL. Accordingly, a plurality of cell strings CSTR are disposed between a plurality of bit lines BL and a common source line CSL. In some embodiments, common source lines CSL are arranged in a two-dimensional plane. The same voltage is typically applied to common source lines CSL. However, common source lines CSL can be individually controlled.

Each of cell strings CSTR comprises a ground select transistor GST connected to a common source line CSL, a string select transistor SST connected to a bit line BL, and a plurality of memory cell transistors MCT disposed between ground select transistors GST and string select transistors SST. Ground select transistor GST, string select transistor SST, and memory cell transistors MCT are connected to each other in series.

A common source line CSL is commonly connected to sources of ground select transistors GST. In addition, ground select lines GSL, word lines WL0 through WL3, and string selection lines SSL disposed between common source lines CSL and bit lines BL are used as gate electrodes of ground select transistors GST, memory cell transistors MCT, and string select transistors SST. Each of memory cell transistors MCT comprises a memory element.

Figure 10:
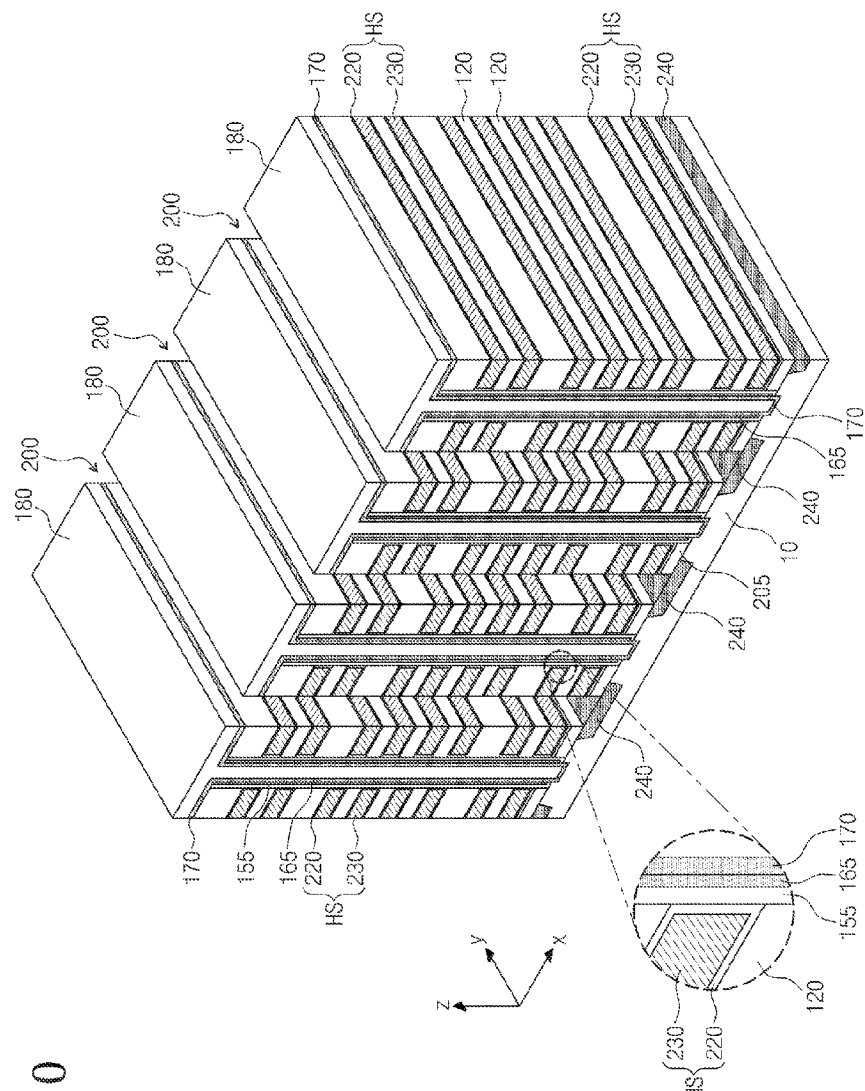
Figure 11:
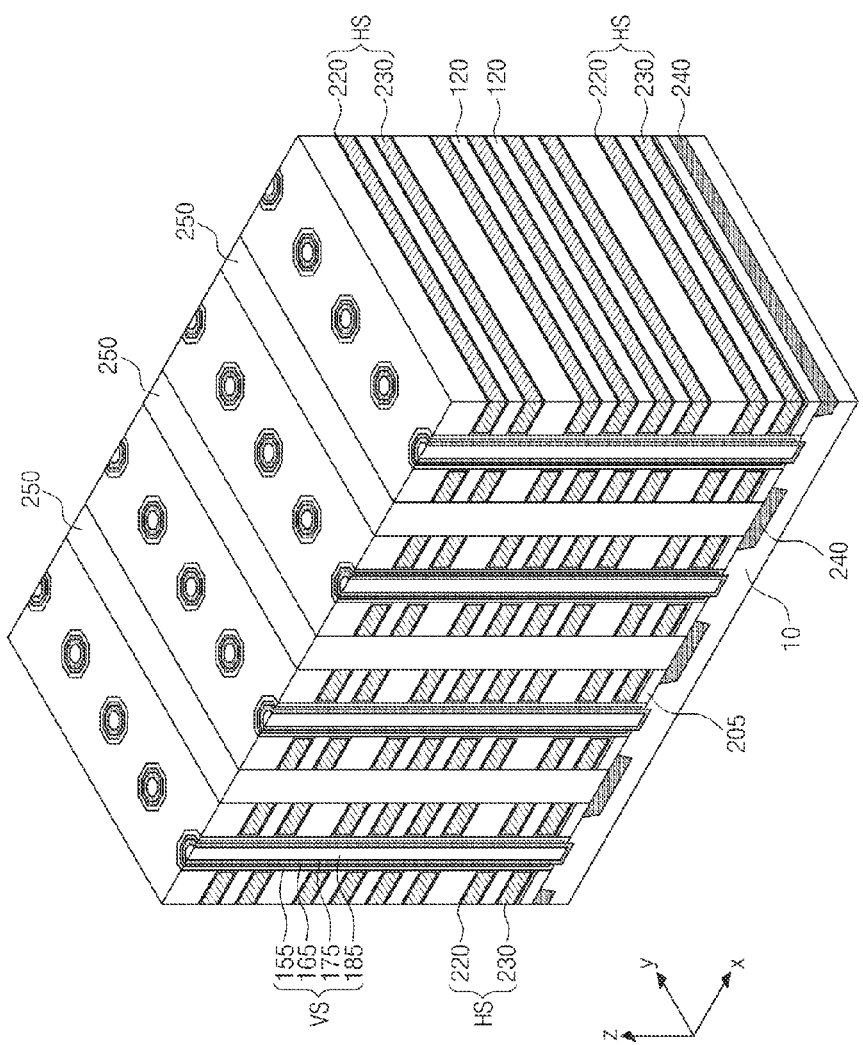
Figure 12:
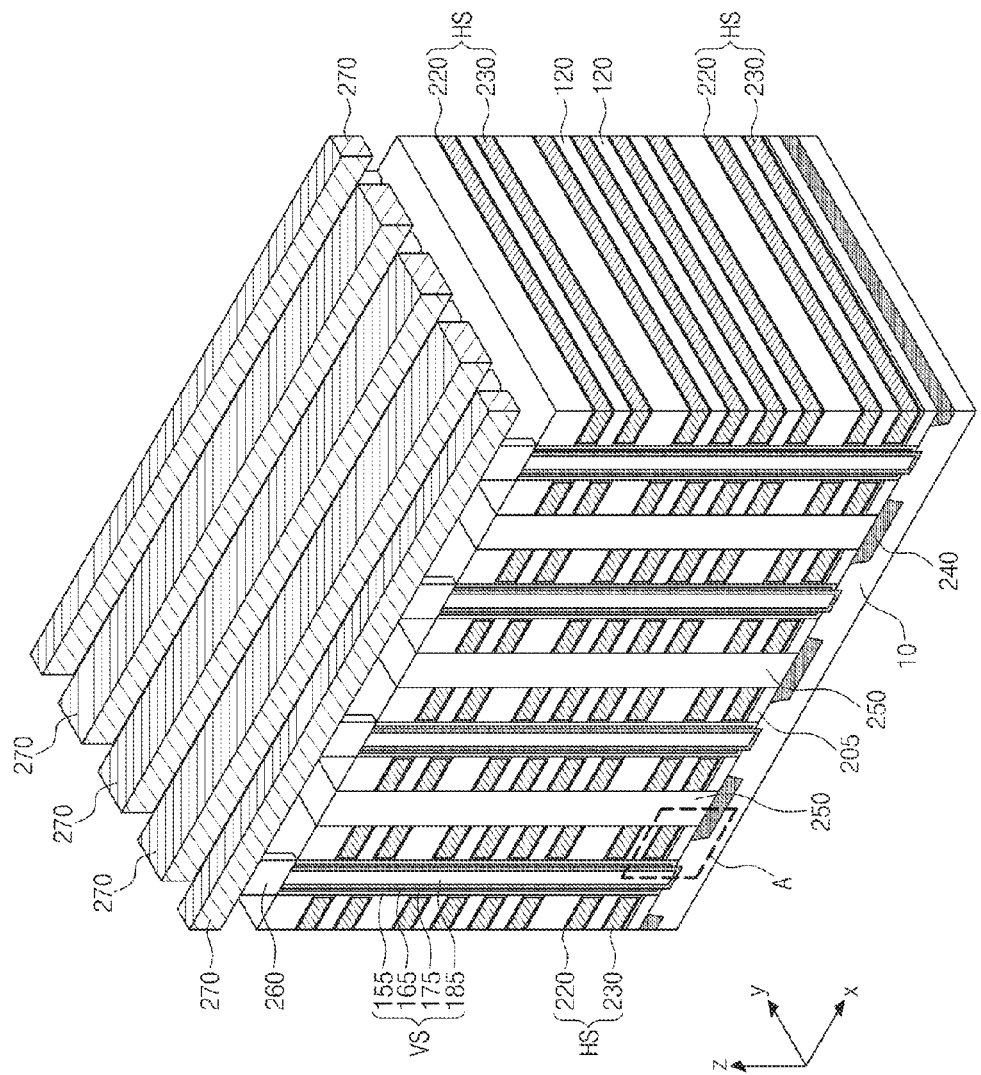
Figure 13A:
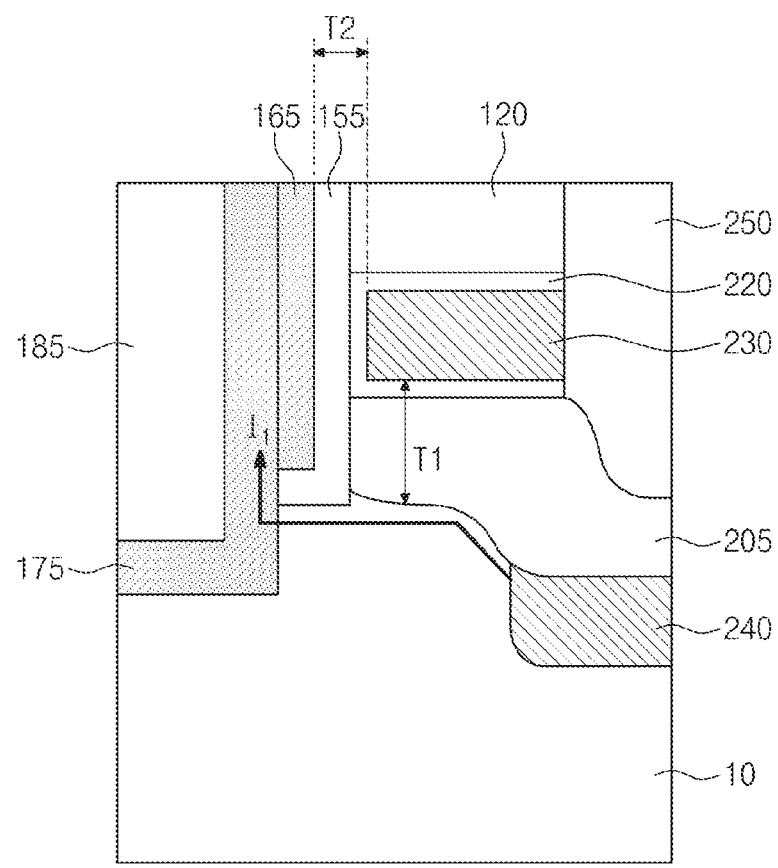
FIGS. 13A and 13B are enlarged views illustrating a portion "A" shown in FIG. 12.
Figure 13B:
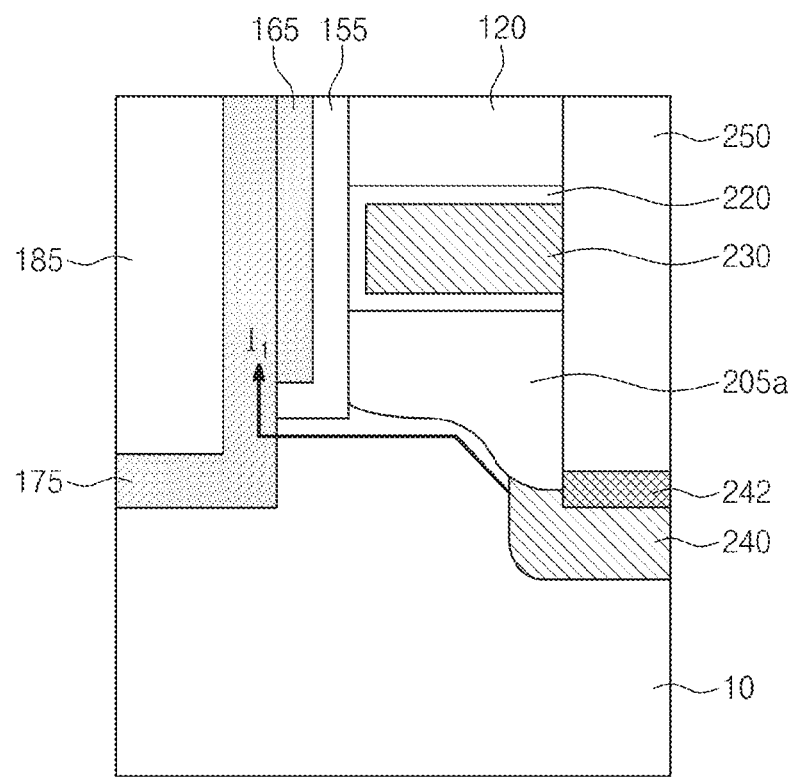

FIGS. 2 through 12 are perspective views for explaining a method of manufacturing a three-dimensional semiconductor memory device according to a first embodiment of the inventive concept, and FIGS. 13A and 13B are enlarged views illustrating a portion "A" of FIG. 12.

Figure 2:
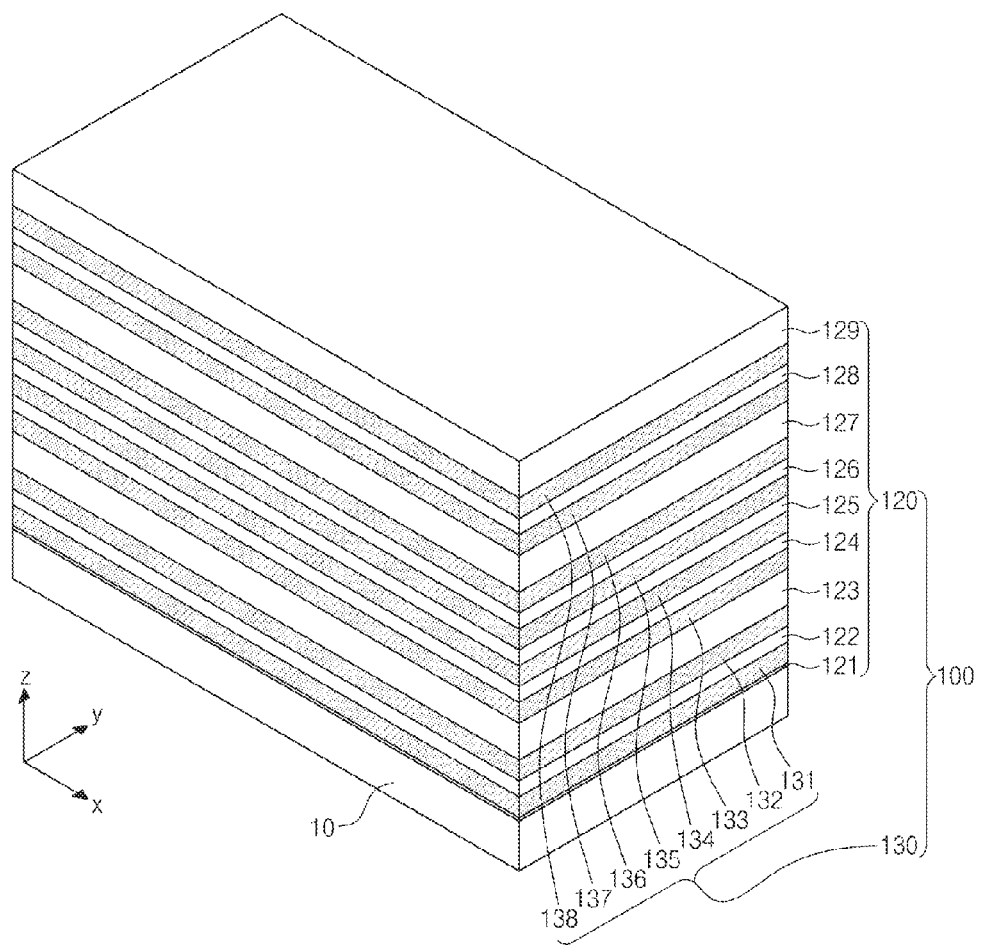
FIGS. 2 through 12 are perspective views for explaining a method of manufacturing a three-dimensional semiconductor memory device according to a first embodiment of the inventive concept.

Referring to FIG. 2, a mold structure (or thin layer structure) 100 is disposed on a substrate 10.

Substrate 10 is typically formed of materials having semiconductor properties, insulating materials, or semiconductors or conductors covered with insulating materials. For example, substrate 10 may be a silicon wafer.

In a modified embodiment, a bottom structure (not shown) including at least one transistor is disposed between substrate 10 and mold structure 100.

Mold structure 100 comprises a plurality of insulation layers 120 (121 through 129) and a plurality of sacrificial layers 130 (131 through 138). As shown in FIG. 1, insulation layers 120 and sacrificial layers 130 are alternately and repeatedly stacked. Sacrificial layers 130 are typically formed of a material having an etch selectivity relative to insulation layers 120. That is, sacrificial layers 130 are typically formed of a material that can be etched while insulation layers 120 are minimally etched during a process of etching sacrificial layers 130 using a predetermined etch recipe.

In general, etch selectivity can be quantitatively expressed by a ratio of an etch rate of insulation layers 120 and an etch rate of sacrificial layers 130. In some embodiments, sacrificial layers 130 are formed of materials that can provide an etch selectivity of 1:10 to 1:200 (for example, 1:30 to 1:100) relative to insulation layers 120. For example, insulation layers 120 may be formed of silicon oxides or silicon nitrides, and sacrificial layers 130 may be formed of silicon, silicon oxides, silicon carbides, or silicon nitrides which are different from those used to form insulation layers 120. In some embodiments, insulation layers 120 are formed of silicon oxide, and sacrificial layers 130 are formed of silicon nitride.

In some embodiments, sacrificial layers 130 have the same thickness. Alternatively, a lowermost sacrificial layer 131 and an uppermost sacrificial layer 138 among sacrificial layers 130 may be thicker than other sacrificial layers 132 through 137 disposed therebetween. In this case, sacrificial layers 132 through 137 may have the same thickness. In some embodiments, lowermost sacrificial layer 131 is thicker than uppermost sacrificial layer 138. In addition, lowermost sacrificial layer 131 may be the thickest sacrificial layer among sacrificial layers 130 of mold structure 100.

In some embodiments, insulation layers 120 have the same thickness or different thicknesses. For example, a lowermost insulation layer 121 among insulation layers 120 may be thinner than sacrificial layers 130, a third insulation layer 123 from the bottom side and third insulation layer 127 from the top side may be thicker than sacrificial layers 130, and the other insulation layers 120 may be thinner or thicker than sacrificial layers 130. In addition, an uppermost insulation layer 129 may be thicker than other insulation layers 121 through 128.

Lowermost insulation layer 121 is a thinnest layer among insulation layers 120 of mold structure 100. Lowermost insulation layer 121 can be a silicon oxide layer formed through a thermal oxidation process for reducing defects on substrate 10 and stresses between mold structure 100 and substrate 10. In some embodiments, lowermost insulation layer 121 has a thickness of about 10 Å to about 100 Å.

Figure 3:
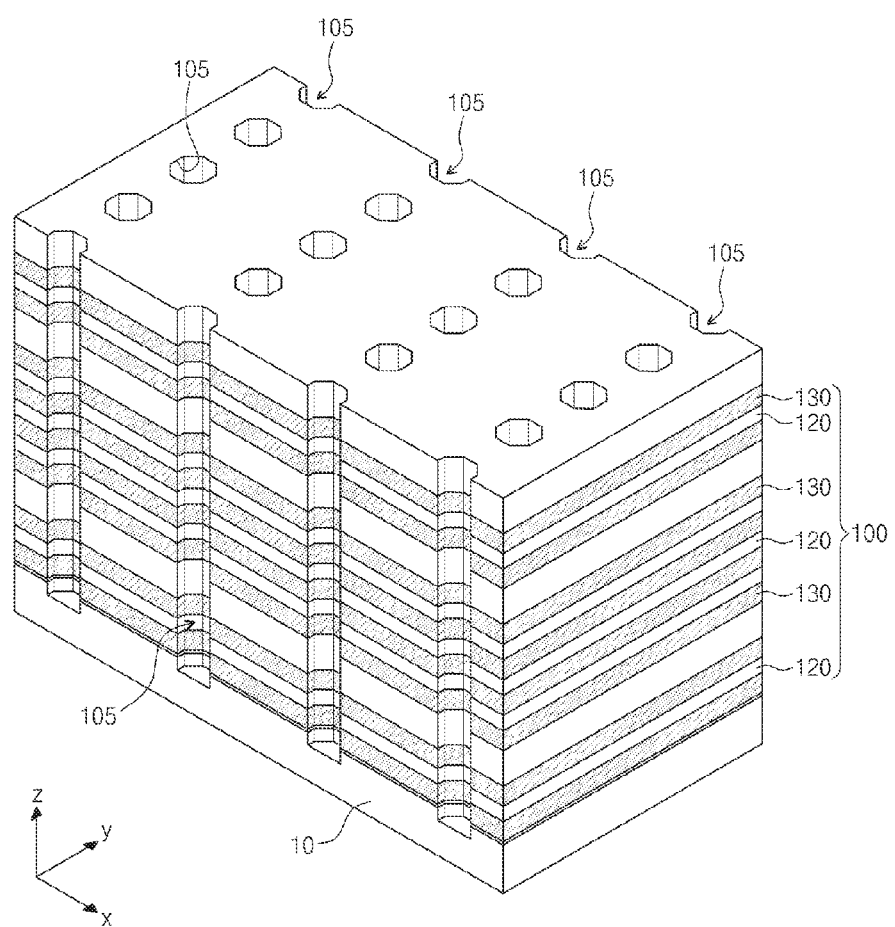
Figure 4:
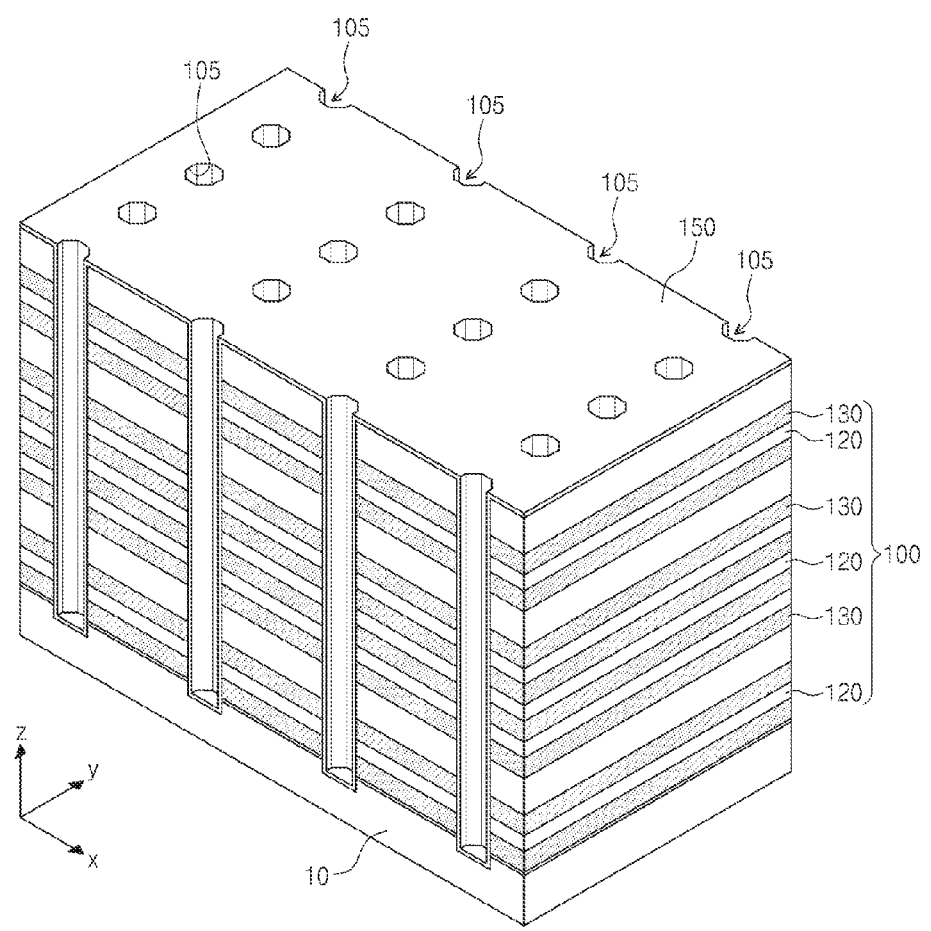

Referring to FIGS. 3 and 4, after openings 105 are formed to penetrate mold structure 100, vertical layers 150 are formed to uniformly cover inner walls of openings 105.

In the embodiment of FIGS. 3 and 4, openings 105 may have a hole shape. That is, each of openings 105 is formed into a shape in which its depth is at least five times its width. Furthermore, in this embodiment, openings 105 are two-dimensionally formed in the top surface (i.e., x-y plane) of substrate 10. That is, openings 105 are isolated regions spaced apart from each other along x-axis and y-axis directions. In another embodiment (not shown), openings 105 are arranged in a zigzag shape in the y-axis direction. In a given direction, the distance between openings 105 may be less than or equal to the width of openings 105. Where openings 105 are arranged in a zigzag shape, more openings 105 may be arranged in a given area.

The forming of openings 105 typically comprises forming a predetermined mask pattern defining positions of openings 105 on mold structure 100 and anisotropically etching mold structure 100 using the mask pattern as an etch mask. Because mold structure 100 comprises at least two kinds of different layers, sidewalls of openings 105 may not be completely vertical to the top surface of substrate 10. For example, openings 105 may become narrower as they approach the top surface of substrate 10.

This irregular width of openings 105 can cause irregularity in operational characteristics of three-dimensionally arranged transistors.

In some embodiments where mold structure 100 are directly disposed on substrate 10, the top surface of substrate 10 is exposed through openings 105 as shown in FIG. 3. Furthermore, as a result of over-etch during the anisotropic etching process substrate 10 can be recessed from opening 105 to a predetermined depth as shown in FIG. 3. Because the structural stability of vertical patterns 155 (refer to FIG. 5) can be improved by recessing substrate 10 as described above, substrate 10 may be intentionally recessed.

Vertical layers 150 extend from openings 105 and cover the top surface of mold structure 100. Each of vertical layers 150 comprises a thin layer or a plurality of thin layers. For example, vertical layers 150 typically comprise at least one thin layer used in memory elements of nonvolatile charge trap memory transistors.

Embodiments of the inventive concept can have various types of thin layers constituting vertical layers 150. Examples of such embodiments are explained in detail with reference to FIGS. 17A through 17H.

Figure 5:
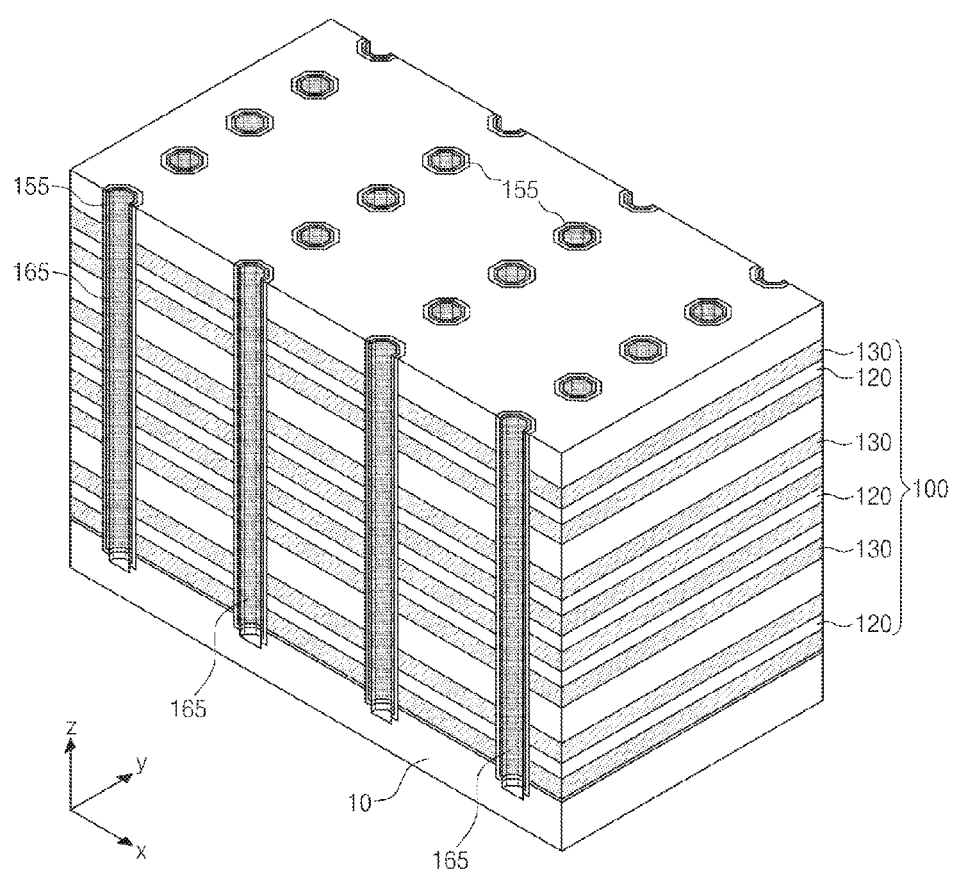

Referring to FIG. 5, vertical patterns 155 and semiconductor spacers 165 are sequentially formed to cover the inner walls of openings 105.

The forming of vertical patterns 155 and semiconductor spacers 165 typically comprises forming first semiconductor layers on vertical layers 150 uniformly, and anisotropically etching the first semiconductor layers and vertical layers 150 to expose substrate 10 through openings 105.

Vertical patterns 155 and semiconductor spacers 165 are formed in a cylindrical shape with both sides opened. Furthermore, as a result of over-etch during the anisotropic etching process of the first semiconductor layers, the top surface of substrate 10 is recessed at portions exposed through semiconductor spacers 165 as shown in FIG. 5.

Alternatively, during the anisotropic etching process, portions of vertical layers 150 disposed at lower sides of semiconductor spacers 165 are not etched. In this case, vertical patterns 155 include bottom portions between the bottom surfaces of semiconductor spacers 165 and the top surface of substrate 10. More specifically, vertical patterns 155 comprise bottom portions between substrate 10 and semiconductor spacers 165 and vertical portions in contact with sidewalls of semiconductor spacers 165. In other words, semiconductor spacers 165 are inserted in vertical portions of vertical patterns 155, and they are in contact with top surfaces of the bottom portions of vertical patterns 155.

In addition, as a result of the anisotropic etching process of the first semiconductor layers and vertical layers 150, the top surface of mold structure 100 is exposed. In this case, vertical patterns 155 and semiconductor spacers 165 are locally disposed in openings 105, respectively. In other words, vertical patterns 155 and semiconductor spacers 165 are two-dimensionally arranged on the x-y plane.

In some embodiments, vertical layers 150 and the first semiconductor layers are uniformly formed on the sidewalls and bottom surfaces of openings 105. As shown in FIG. 5, the deposition thicknesses of vertical layers 150 and the first semiconductor layers is less than half the width of openings 105. That is, openings 105 may not be completely filled with vertical layers 150 and the first semiconductor layers.

The first semiconductor layers typically comprise polycrystalline silicon layers formed by an atomic layer deposition (ALD) method or a chemical vapor deposition (CVD) method. The thickness of the first semiconductor layers is typically about ⅕₀ to about ⅕ the width of openings 105. In a modified embodiment, the first semiconductor layers are formed by an epitaxial technique. According to another modified embodiment, the first semiconductor layers comprise organic semiconductor layers or carbon nanostructures.

Figure 6:
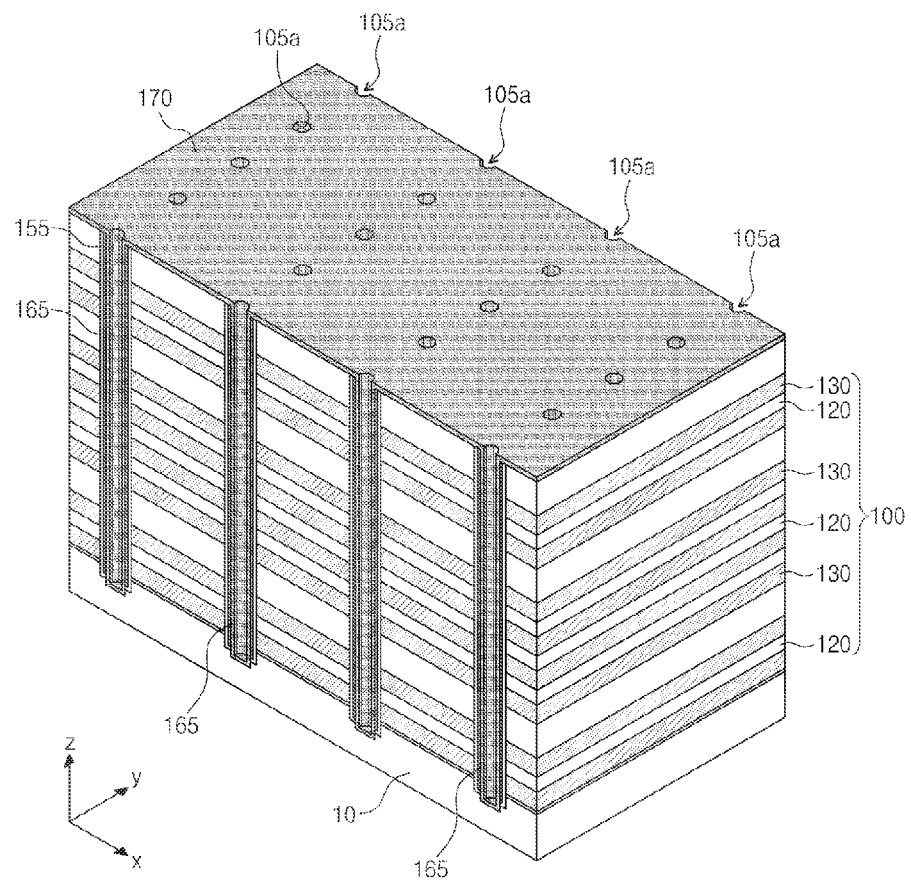
Figure 7:
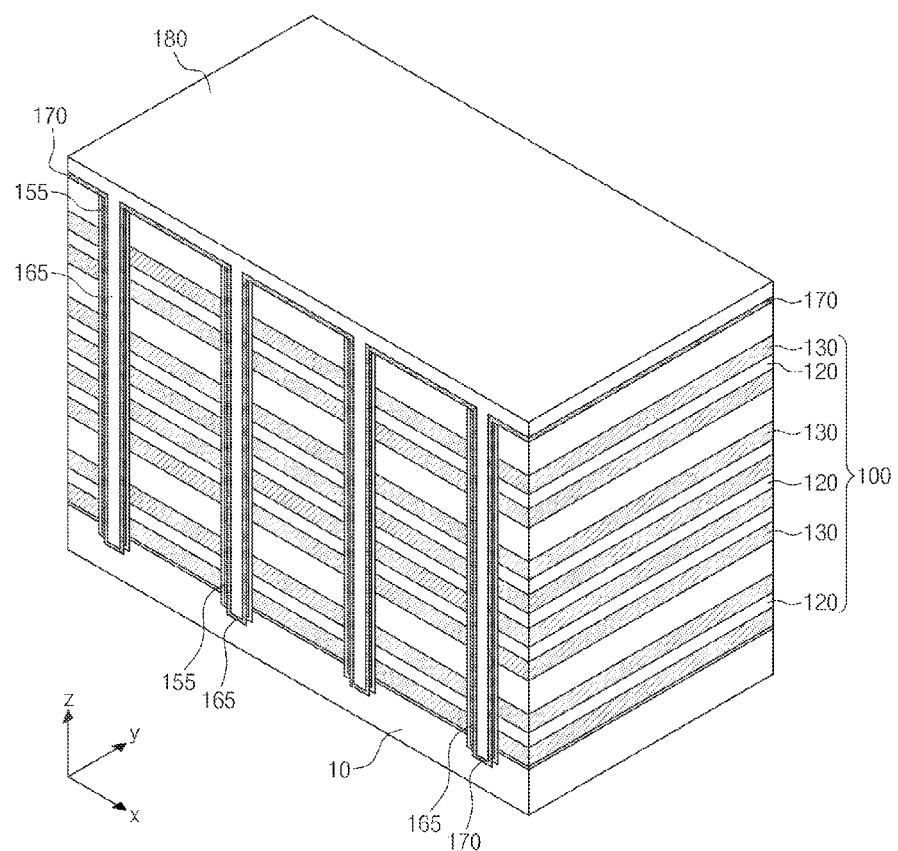

Referring to FIGS. 6 and 7, second semiconductor layers 170 and buried insulation layers 180 are sequentially formed on a resultant structure produced after the formation of vertical patterns 155.

Second semiconductor layers 170 may be polycrystalline silicon layers formed by an ALD method or a CVD method. In some embodiments, second semiconductor layers 170 are uniformly formed to a predetermined thickness such that openings 105 are not completely filled with second semiconductor layers 170. For example, as shown in FIG. 6, second semiconductor layers 170 may define pin holes 105a in openings 105.

Buried insulation layers 180 may be formed to fill the pin holes 105a. Buried insulation layers 180 can be formed of one of insulation materials and silicon oxides by using spin-on-glass (SOG) technology. In some embodiments, before forming buried insulation layers 180, a hydrogen annealing process may be performed to thermally treat a resultant structure including second semiconductor layers 170 under a gas atmosphere including hydrogen or deuterium. Most crystalline defects of semiconductor spacers 165 and second semiconductor layers 170 can be cured by the hydrogen annealing process.

In modified embodiment, second semiconductor layers 170 are formed to fill openings 105 where semiconductor spacers 165 are formed. In this case, buried insulation layers 180 are not formed.

In some embodiments, semiconductor spacers 165 and second semiconductor layers 170 comprise silicon (Si), germanium (Ge), or a mixture thereof. In addition, semiconductor spacers 165 and second semiconductor layers 170 can be semiconductors doped with impurities, or intrinsic semiconductors not doped with impurities. In addition, semiconductor spacers 165 and second semiconductor layers 170 may have at least one of a single crystalline structure, an amorphous crystalline structure, and a polycrystalline structure.

Semiconductor spacers 165 and second semiconductor layers 170 may be formed in openings 105 by a CVD method or an ALD method. Where semiconductor patterns are formed by deposition technology, discontinuous interfaces may be formed due to different crystalline structures of the semiconductor patterns and substrate 10. In addition, in some embodiments, the semiconductor patterns are formed by depositing amorphous silicon or polycrystalline silicon and performing a heat treatment process such as laser annealing on the deposited amorphous or polycrystalline silicon to cause phase transition from amorphous or polycrystalline to single crystalline. In some embodiments, an epitaxial process is performed using substrate 10 exposed through openings 105 as a seed layer, so as to form the semiconductor patterns.

Second semiconductor layers 170 are deposited to a thickness less than or equal to half the width of openings 105. In this case, the semiconductor patterns may fill openings 105 partially to define empty regions in the center portions of openings 105. For example, second semiconductor layers 170 may be formed in openings 105 in the shape of a pipe, a hollow cylinder, or a cup. The empty regions defined by second semiconductor layers 170 may be filled with buried insulation patterns, and the buried insulation patterns may be formed of an insulating material having good gap-filling characteristics. For example, buried insulation patterns 185 may be formed of a high-density plasma oxide layer, an SOG layer, and/or a CVD oxide layer. In some embodiments, second semiconductor layers 170 are completely filled in openings 105 in the shape of a cylinder through a deposition process.

Figure 8:
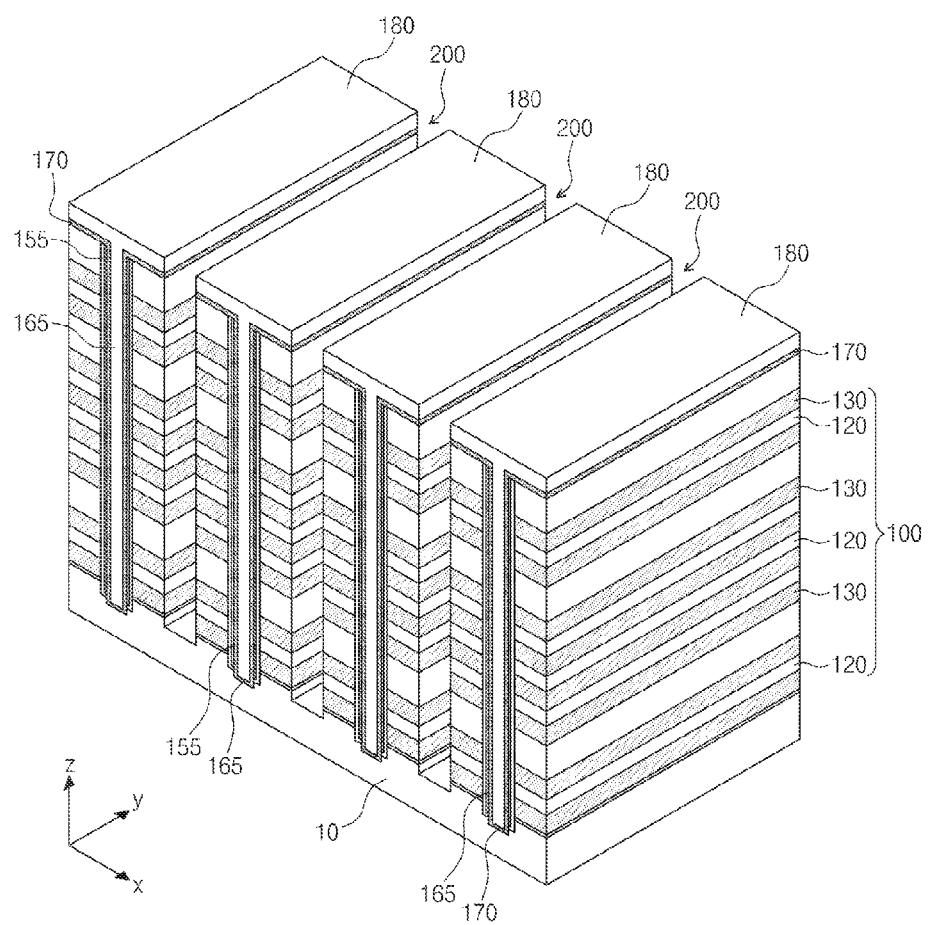

Referring to FIG. 8, trenches 200 penetrating mold structure 100 are formed to expose sacrificial layers 130 and insulation layers 120. As shown in FIG. 8, trenches 200 are spaced apart from openings 105, and they extend between openings 105.

The forming of trenches 200 comprises forming an etch mask on the top of mold structure 100 or buried insulation layers 180, and anisotropically etching the layers disposed under the etch mask until substrate 10 is exposed. As shown in FIG. 8, second semiconductor layers 170 and buried insulation layers 180 disposed on the top of mold structure 100 are patterned to define upper inlets of trenches 200. As a result of over-etching during the anisotropic etching process, substrate 10 may be recessed from trenches 200 to a predetermined depth as shown in FIG. 8. Because substantially the same layers are etched, trenches 200 become narrower as they approach the top surface of substrate 10, similar to openings 105.

In some embodiments, a pair of trenches 200 is formed at both sides of a line of openings 105. Accordingly, the number of openings 105 arranged in the x-axis direction and having the same y-axis coordinate can be equal to the number of trenches 200.

Figure 9:
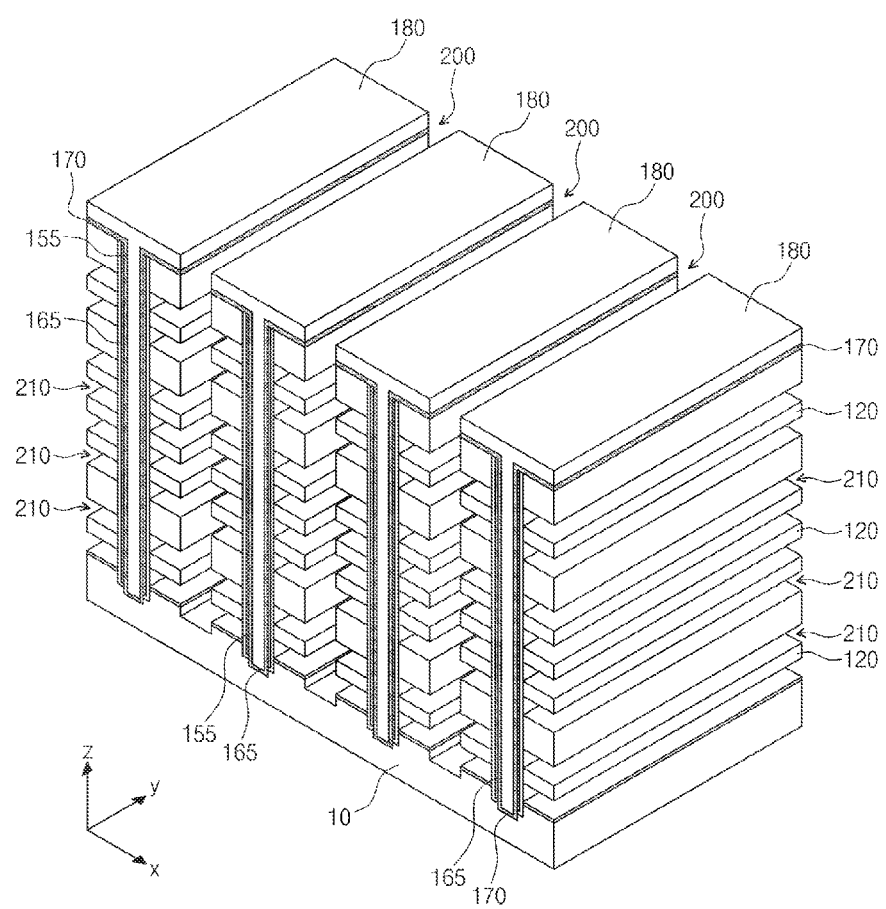

Referring to FIG. 9, sacrificial layers 130 exposed through trenches 200 are selectively removed to form recess regions 210 between insulation layers 120.

Recess regions 210 may be gap regions extending horizontally from trenches 200 to expose sidewalls of vertical patterns 155. Outer boundaries of recess regions 210 are defined by insulation layers 120 disposed at upper and lower sides of recess regions 210 and trenches 200 disposed at both sides of recess regions 210. In addition, internal boundaries of recess regions 210 are defined by vertical patterns 155 penetrating recess regions 210 vertically.

The forming of recess regions 210 typically comprises horizontally etching sacrificial layers 130 in a manner such that sacrificial layers 130 are selectively etched with reference to insulation layers 120 and vertical patterns 155 according to a predetermined etch recipe. For example, where sacrificial layers 130 are silicon nitride layers, and insulation layers 120 are silicon oxide layers, the etching process may be performed using an etchant comprising a phosphoric acid.

Recess regions 210 are formed by removing sacrificial layers 130 disposed between insulation layers 120. That is, recess regions 210 may extend between insulation layers 120 horizontally from trenches 200. Recess regions 210 partially expose the sidewalls of vertical patterns 155. The lowermost recess regions 210 are defined by insulation layer 121. The vertical thicknesses of recess regions 210 (z-axis length of recess regions 210) is determined by the deposition thicknesses of sacrificial layers 130 shown in FIG. 2.

A resultant structure including recess regions 210 is oxidized to form lower oxide layers 205 on substrate 10 at lower sides of recess regions 210 and trenches 200 as shown in FIGS. 13A and 13B.

The oxidation process can be carried out by performing a heat treatment under a gas atmosphere including oxygen. In the heat treatment, oxygen atoms permeate into the lowermost insulation layer 121 to react with silicon atoms of substrate 10, and thus silicon oxide layers are formed. In this way, lower oxide layers 205 are formed by consuming substrate 10 and recess regions 210. Accordingly, the top surface of substrate 10 is lowered at recess regions 210. That is, the distance between the top surface of substrate 10 and the bottom surfaces of the semiconductor patterns is reduced under recess regions 210. Lower oxide layers 205 formed by the oxidation process are in contact with sidewall parts of vertical patterns 155 disposed in substrate 10. In some embodiments, lower oxide layers 205 entirely cover sidewall parts of vertical patterns 155 making contact with substrate 10.

Vertical patterns 155 and insulation layers 120 exposed through recess regions 210 are formed of insulation materials, and thus when the oxidation process is performed, oxide layers may not formed on the sidewalls of vertical patterns 155 and the surfaces of insulation layers 120. Damaged parts of vertical patterns 155 exposed through recess regions 210 may be cured by the oxidation process.

In various alternative embodiments, the oxidation process may be a thermal oxidation process or a radical oxidation process. Examples of the thermal oxidation process include a dry oxidation process using oxygen and a wet oxidation process using steam as an oxidant. The thermal oxidation process may be performed by a wet oxidation method of a rapid reaction rate and good layer quality. Gas such as $O_2$ gas, $H_2O$ gas (steam), a mixture of $H_2$ gas and $O_2$ gas, $H_2$ gas, and a mixture of $Cl_2$ gas and $O_2$ gas may be used as a source gas in the oxidation process. In addition, the oxidation process may be performed at a pressure of about 1 mTorr to about 50 mTorr and a temperature of about 600° C. to about 1100° C. The radical oxidation process is performed by generating oxygen radicals by activating oxygen source gas to cause reaction between the oxygen radicals and silicon. Since reaction of oxygen radicals is fast in the radiation oxidation process, lower oxide layers 205 may be rapidly formed by using the radical oxidation process. Lower oxide layers 205 are formed to a thickness of about 100 Å to about 500 Å in the oxidation process.

In some embodiments, vertical patterns 155 exposed through recess regions 210 are oxide layers. In this case, vertical patterns 155 may have a denser and more durable structure by the radical oxidation process. In addition, where vertical patterns 155 exposed through recess regions 210 are oxide layers, a plasma nitriding process and an annealing process may be performed after recess regions 210 are formed. These processes can cure defects in the oxide layers and make them denser.

In another embodiment, vertical patterns 155 exposed through recess regions 210 may be nitride layers. In this case, the oxidation process may cure defects on the nitride layers and form dense oxynitride layers on the nitride layers.

Referring to FIG. 10, horizontal structures HS are formed to fill recess regions 210. Horizontal structures HS comprise horizontal patterns 220 covering inner walls of recess regions 210, and conductive patterns 230 filling remaining spaces of recess regions 210.

The forming of horizontal structures HS typically comprises sequentially forming horizontal layers and conductive layers to fill recess regions 210, and removing the conductive layers from trenches 200 so that conductive patterns 230 remain in recess regions 210.

Like vertical layers 150, each of the horizontal layers or patterns 220 typically comprises a thin layer or a plurality of thin layers. In some embodiments, horizontal patterns 220 comprise blocking dielectric layers of nonvolatile charge trap memory transistors. As indicated above, certain embodiments are characterized by different types of thin layers constituting vertical layers 150 and horizontal patterns 220. Such embodiments will be explained later in detail with reference to FIGS. 17A through 17H.

The conductive layers are formed to fill recess regions 210 covered with the horizontal layers. At this time, trenches 200 can be completely or partially filled with the conductive layers. The conductive layers may include doped silicon, metal materials, metal nitrides, and metal silicides. For example, the conductive layers may include tantalum nitride or tungsten.

In some embodiments, the conductive layers are formed by a deposition technology such as CVD or ALD for good step coverage. The conductive layers may be uniformly formed in trenches 200 while filling recess regions 210. For instance, the conductive layers may be formed to a thickness less than or equal to half the thickness of recess regions 210. Where the width of trenches 200 is greater than the thickness of recess regions 210, the conductive layers may partially fill trenches 200, and thus empty regions may be formed in center portions of trenches 200.

In some embodiments, the empty regions open upwardly. In this case, the forming of conductive patterns 230 comprises removing the conductive layers from trenches 200 by an isotropic etching method. In some embodiments, the conductive layers are formed to fill trenches 200, and the forming of conductive patterns 230 comprises anisotropically etching the conductive layers formed in trenches 200.

In some embodiments, after conductive patterns 230 are formed, impurity regions 240 are further formed. As shown in FIG. 13A, after lower oxide layers 205 are formed, impurity regions 240 are formed by implanting impurity ions into substrate 10. Consequently, impurity regions 240 are formed below lower oxide layers 205. The vertical thickness of lower oxide layers 205 under lowermost conductive patterns 230 can be different from the vertical thickness of lower oxide layers 205 on impurity regions 240.

In some embodiments, impurity regions 240 have a conductive type different from that of substrate 10. On the other hand, regions (hereinafter referred to as contact regions) of substrate 10 making contact with second semiconductor layers 170 may have the same conductive type as substrate 10. Thus, impurity regions 240 form PN junctions together with substrate 10 or semiconductor layers 170.

In some embodiments, impurity regions 240 are connected to each other and have the same electrical potential, and in other embodiments, impurity regions 240 are electrically separated so that they can have different electrical potentials. In other embodiments, impurity regions 240 form independent source groups that include different impurity regions and are electrically separated from each other to have different potentials.

Referring to FIG. 13B, after anisotropically etching the conductive layers, lower oxide layers 205 are patterned to vertically separate conductive patterns 230. In this case, the top sides of impurity regions 240 are opened. Thereafter, electrode separation patterns 250 are formed on impurity regions 240 to fill trenches 200.

Referring to FIG. 11, electrode separation patterns 250 are formed to fill trenches 200. The forming of the electrode separation patterns 250 comprises forming electrode separation layers on a resultant structure where impurity regions 240 are formed, and etching the resultant structure to expose the top surface of mold structure 100. The electrode separation layers comprise at least one of silicon oxide layers, silicon nitride layers, and silicon oxynitride layers, and the etching process is performed using planarization technology such as chemical mechanical polishing technology or etch-back technology. As a result of the planarization etching, buried insulation layers 180 and second semiconductor layers 170 are locally disposed in openings 105 to form buried patterns 185 and a semiconductor body 175 as show in FIG. 11.

In some embodiments, a vertical structure VS is formed by a vertical pattern 155, a semiconductor spacer 165, and a semiconductor body 175. A plurality of vertical structures VS penetrate mold structure 100 and are two-dimensionally arranged on substrate 10. In the above-described structure, positions of vertical structures VS are defined by openings 105. Buried patterns 185 constitute vertical structures VS.

Figure 14:
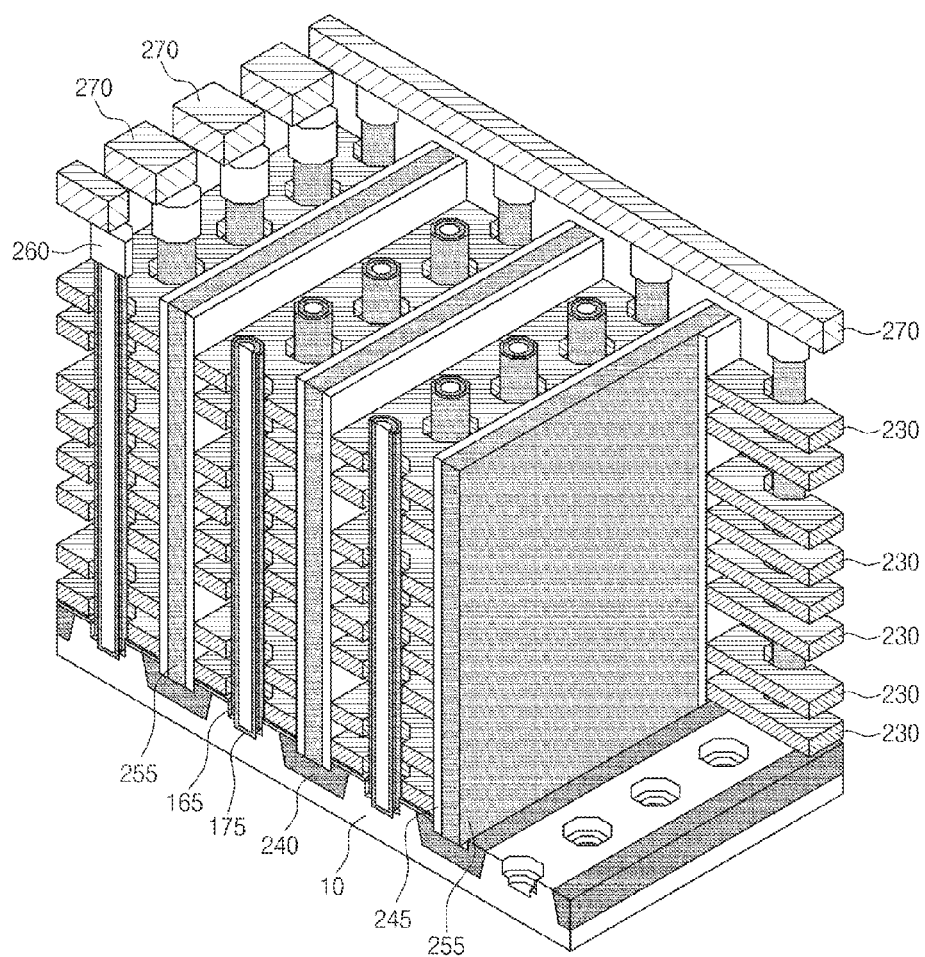
FIGS. 14 through 16 are perspective views illustrating modified examples of the three-dimensional semiconductor memory device of FIGS. 2 through 12.

As shown in FIGS. 13A and 13B, electrode separation patterns 250 are disposed on lower oxide layers 205 or impurity regions 240. In another embodiment, silicide layers 242 are formed on top surfaces of impurity regions 240, and as shown in FIG. 14, metal patterns 255 penetrate lower oxide layers 205 and make contact with impurity regions 240.

Referring to FIG. 12, upper plugs 260 are formed on the top sides of vertical structures VS, respectively, and upper interconnections 270 are formed on the top sides of upper plugs 260 to connect them to each other.

In some embodiments, upper regions of semiconductor spacers 165 and semiconductor body 175 comprise impurity regions (not shown). The bottom sides of the impurity regions may be higher than the top sides of the uppermost horizontal structures HS of horizontal structures HS. In addition, the impurity regions may be doped with a conductive type different from that of parts of semiconductor spacers 165 disposed under the impurity regions. Thus, the impurity regions may form diodes together with their lower regions. In some embodiments, upper plugs 260 are formed of doped silicon or a metal material.

In some embodiments, upper plugs 260 are formed of a silicon layer doped with a conductive type different from that of semiconductor spacers 165 and semiconductor body 175. In this case, upper plugs 260 form PN junctions together with semiconductor spacers 165 and semiconductor body 175.

Each of upper interconnections 270 is electrically connected to semiconductor spacers 165 and semiconductor body 175 through upper plugs 260. Upper interconnections 270 are arranged across horizontal structures HS. In one embodiment comprising a NAND flash memory, upper interconnections 270 are used as bit lines connected to ends of a plurality of cell strings.

The three-dimensional semiconductor memory device of the first embodiment will now be described with reference to FIGS. 12, 13A, and 13B.

Referring to FIG. 12, horizontal structures HS are three-dimensionally arranged on substrate 10. Vertical structures VS penetrate horizontal structures HS perpendicularly, and they are two-dimensionally arranged on substrate 10. Each of horizontal structures HS comprises one conductive pattern 230 and horizontal pattern 220.

Long axes of conductive patterns 230 are parallel with the top surface of substrate 10 (that is, the x-y plane). Openings 105 are formed in conductive patterns 230, and vertical structures VS penetrate conductive patterns 230 through openings 105. Horizontal patterns 220 are disposed between conductive patterns 230 and vertical structures VS. Accordingly, horizontal patterns 220 cover inner walls of conductive patterns 230 or sidewalls of openings 105. Furthermore, in some embodiments, horizontal patterns 220 extend horizontally from openings 105 and cover top and bottom surfaces of conductive patterns 230.

Conductive patterns 230 are typically formed of at least one of doped silicon, a metal material, a metal nitride, and a metal silicide. For example, conductive patterns 230 may comprise tantalum nitride or tungsten. Each of horizontal patterns 220 may be formed by a thin layer or a plurality of thin layers. For example, horizontal patterns 220 may include at least insulation layers used as memory elements of charge trap nonvolatile memory transistors.

Vertical structures VS comprise semiconductor patterns SP connected to the top surface of substrate 10, and vertical patterns 155 disposed between semiconductor patterns SP and horizontal structures HS. In some embodiments, semiconductor pattern SP comprise semiconductor spacer 165 and semiconductor body 175. Semiconductor spacers 165 have a cylindrical shape with opened top and bottoms sides, and semiconductor body 175 has a cup shape covering the inner walls of semiconductor spacers 165 and the top surfaces of substrate 10. That is, semiconductor body 175 has a predetermined thickness so that openings 105 are not completely filled with the semiconductor body 175 and pin holes 105a are defined in opening 105. Pin holes 105a are filled with buried patterns 185.

A crystalline structure varying process, such as an epitaxial process comprising laser annealing, is performed on semiconductor body 175 or semiconductor spacers 165, and thus semiconductor body 175 or semiconductor spacers 165 has a crystalline structure different from that of polycrystalline silicon formed through a CVD process. For example, lower and upper regions of semiconductor body 175 or semiconductor spacers 165 may have different grain sizes. In the previous embodiments or the following embodiments, semiconductor body 175 or semiconductor spacers 165 may have the above-described crystalline structure characteristics.

Vertical patterns 155 have a cylindrical shape with opened top and bottom sides. Vertical patterns 155 comprise bottom portions extending below semiconductor spacers 165. Vertical patterns 155 extend vertically between semiconductor patterns SP and horizontal structures HS such that one semiconductor pattern is entirely covered by one single body of vertical pattern 155.

Semiconductor patterns SP comprise a material having semiconductor characteristics. For example, semiconductor spacers 165 and semiconductor body 175 may comprise one of polycrystalline silicon, organic semiconductor layers, and carbon nanotube structures. Each of vertical patterns 155 typically comprises a thin layer or a plurality of thin layers. For example, vertical patterns 155 typically comprise at least insulation layers used as memory elements of charge trap nonvolatile memory transistors.

Horizontal structures HS and vertical structures VS may define localized intersecting regions therebetween, with vertical adjacent regions vertically adjacent to the intersection regions, and horizontal adjacent regions horizontally adjacent to the intersecting regions. The vertically adjacent regions may be sidewalls of vertical structures VS between horizontal structures HS, and the horizontal adjacent regions may be surfaces of horizontal structures HS disposed between vertical structures VS. According to certain embodiments, horizontal pattern 220 and vertical pattern 155 are on the intersecting regions, and horizontal pattern 220 extend to the horizontal adjacent regions and vertical pattern 155 extend to the vertical adjacent regions.

In the three-dimensional semiconductor memory device explained with reference to FIGS. 1 through 12, because of the presence of vertical pattern 155 inserted at the predetermined depth in the top surface of substrate 10, a current path $I_1$ passing through impurity region 240 may improve. In addition, inversion regions may be selectively formed in substrate 10 for current path $I_1$, but vertical patterns 155 may prevent generation of the inversion region. The inversion region is formed by voltage applied to the lowermost conductive pattern 230, so resistance of the inversion region may be exponentially increased according to a distance in a straight line from the lowermost conductive pattern 230.

In some embodiments, as shown in FIGS. 13A and 13B, lower oxide layer 205 is disposed under the lowermost conductive pattern 230 and is in contact with substrate 10. Here, a sidewall of lower oxide layer 205 is covered by vertically extending vertical pattern 155. In addition, the distance between the top surface of substrate 10 and the bottom surface of the lowermost conductive pattern 230 is greater than the distance between a sidewall of the lowermost conductive pattern 230 and a sidewall of a semiconductor pattern (that is, a sidewall of the semiconductor spacer 165). In other words, the vertical thickness of lower oxide layer 205 may be greater than the horizontal thickness of the vertical pattern 155.

In addition, because lower oxide layer 205 is formed through an oxidation process, the bottom surface of lower oxide layer 205 in contact with substrate 10 may be rounded.

For instance, as shown in FIG. 13A, lower oxide layer 205 may extend to the top surface of impurity region 240.

As described above, because lower oxide layer 205 is formed at a side of vertical pattern 155 inserted in the top surface of substrate 10, an inversion region can be formed in substrate 10 under lower oxide layer 205 by applying a voltage to the lowermost conductive pattern 230. The inversion region formed at substrate 10 is connected to inversion regions formed at semiconductor body 175. That is, because lower oxide layer 205 is formed at a side of the vertical pattern 155 inserted in the top surface of substrate 10, generation of inversion regions may not be reduced in substrate 10, and current path may not be cut off.

Figure 15:
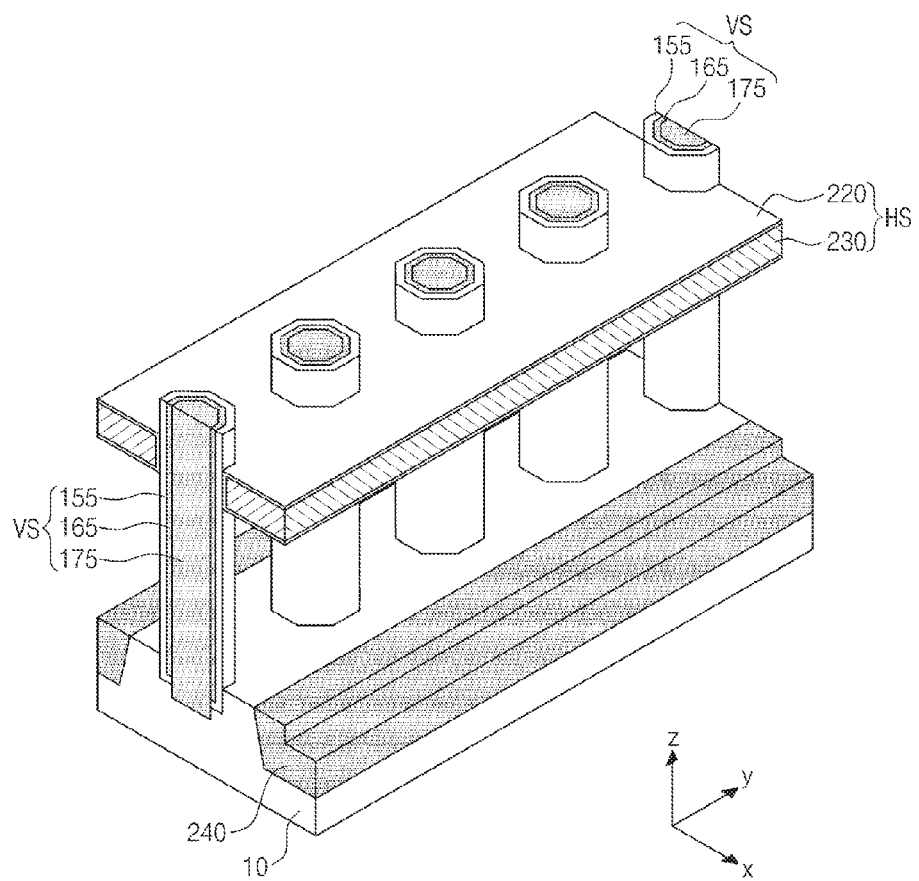
Figure 16:
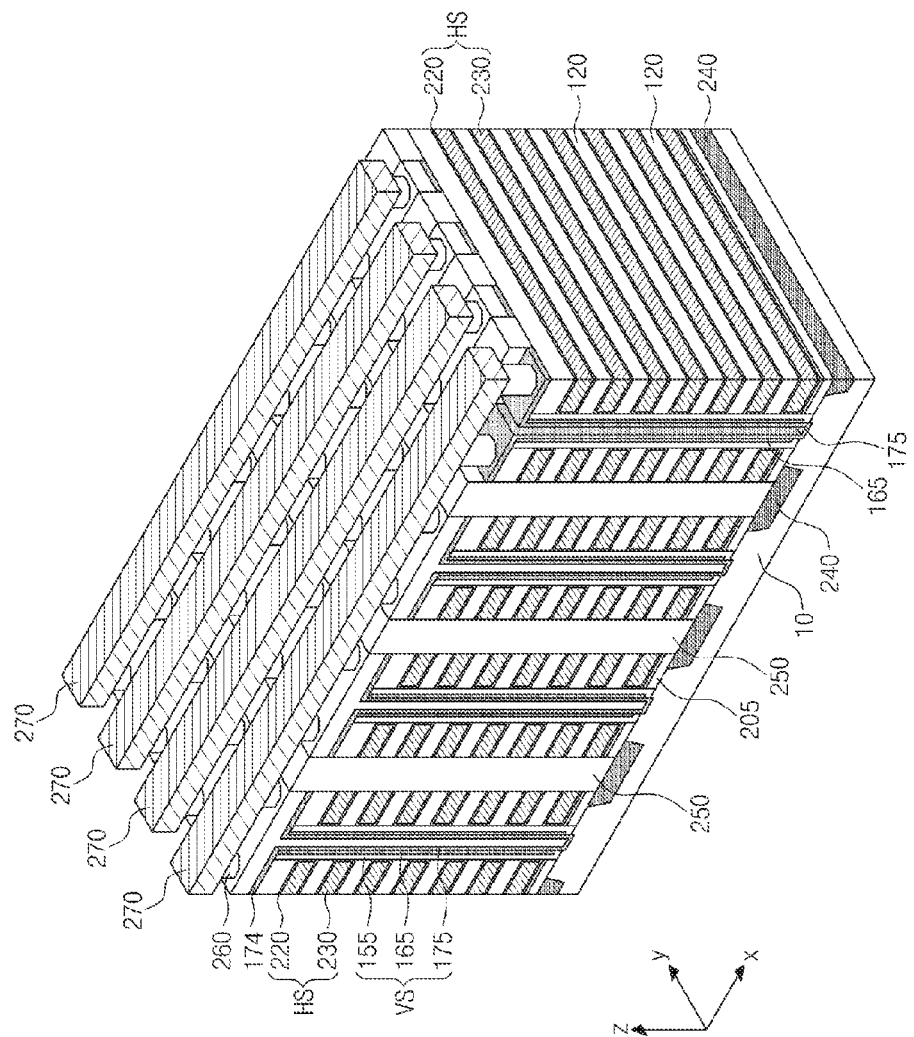

FIGS. 14 through 16 are perspective views illustrating modified examples of the three-dimensional semiconductor memory device of FIGS. 2 through 12.

In the embodiment of FIG. 14, metal patterns 255 in contact with impurity regions 240 are formed in trenches 200. In addition, trench spacers 245 are further formed on sidewalls of trenches 200 to electrically separate metal patterns 255 from conductive patterns 230.

Metal patterns 255 are formed of a conductive material (such as tungsten), and barrier metal layers (such as metal nitride layers, not shown) or silicide layers (not shown) are further formed between impurity regions 240 and metal patterns 255. Trench spacers 245 are typically formed of an insulation material such as silicon oxide.

Metal patterns 255 and trench spacers 245 are formed after impurity regions 240 are formed as described with reference to FIG. 10. Trench spacers 245 are formed by forming insulation layers uniformly on inner walls of trenches 200 and anisotropically etching the insulation layers to expose the top surfaces of impurity regions 240.

Metal patterns 255 are formed by forming metal layers in trenches 200 where trench spacers 245 are formed, and planarizing the metal layers by etching.

Metal patterns 255 and trench spacers 245 penetrate conductive patterns 230 perpendicularly, and they horizontally extend across the semiconductor patterns SP. In some embodiments, the thickness (z-axis length) and length (y-axis length) of the metal patterns 255 is substantially equal to those of trenches 200.

Vertical conductive patterns 255 have a lower resistivity than impurity region 240, and they are connected to impurity region 240 to improve a transmission speed of an electrical signal passing through impurity regions 240. Because a top surface of the vertical conductive patterns 255 is higher than that of the uppermost layer among conductive patterns 230, technical difficulties of a wiring formation process for electrical connection to the impurity region 240 may be reduced. Because vertical conductive patterns 255 may provide a shielding layer between conductive patterns 230, capacitive coupling between horizontally adjacent conductive patterns 230 may be reduced. As a result, disturbance may be reduced during program and read operations.

In the embodiment of FIG. 15, each of vertical structures VS comprises a semiconductor body 175, a pair of vertical patterns 155, and a pair of semiconductor spacers 165. The semiconductor body 175 may have a cylindrical shape.

In the embodiment of FIG. 16, a portion of openings 105 shown in FIG. 3 has a hexahedral shape where aspect ratios of sections projected on the xy plane and the xz plane are greater than about 5. The lengths in the y and z directions of opening 105 may be five times that in the x direction thereof. In other words, openings 105 explained with reference to FIG. 3 may be formed with a line shape. Where openings 105 are formed with a line shape, vertical structures VS may be formed in openings 105 with insulation patterns being disposed therebetween.

The forming of vertical structures VS comprises sequentially forming second semiconductor layers and buried insulation layers in openings 105 after forming vertical patterns 155 and semiconductor spacers 165 in openings 105, and patterning the second semiconductor layers and the buried insulation layers to form vertical structures VS having a rectangular planar shape in openings 105.

According to the above-described structure, a plurality of vertical structures VS are disposed in opening 105, and a plurality of insulation patterns ISO are disposed between vertical structures VS. In addition, each of vertical structures VS comprises a semiconductor body portion 175, a pair of vertical patterns 155, and a pair of semiconductor spacers 165.

FIGS. 17A through 17H are perspective views illustrating data storage layer structures according to embodiments of the inventive concept.

These structures can be used, for instance, in a three-dimensional semiconductor memory device such as a flash memory. In this case, the three-dimensional semiconductor memory device may comprise a data storage layer comprising a tunnel insulation layer TIL, a charge storage layer CL, and a first blocking insulation layer BIL1. In some embodiments, the data storage layer further comprises a second blocking insulation layer BIL2 disposed between first blocking insulation layer BIL1 and a conductive pattern 230. In addition, the data storage layer may further comprise a capping layer CPL disposed between charge storage layer CL and the first blocking insulation layer BIL1. The layers of the data storage layer may be formed by deposition technology (such as CVD or ALD technology) for good step coverage.

Figure 17A:
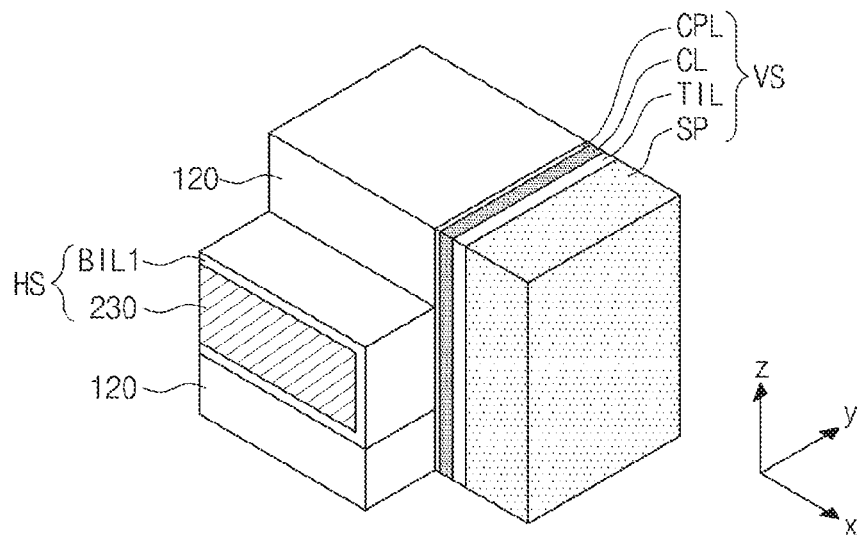
FIGS. 17A through 17H are perspective views illustrating data storage layer structures according to various embodiments of the inventive concept.
Figure 17B:
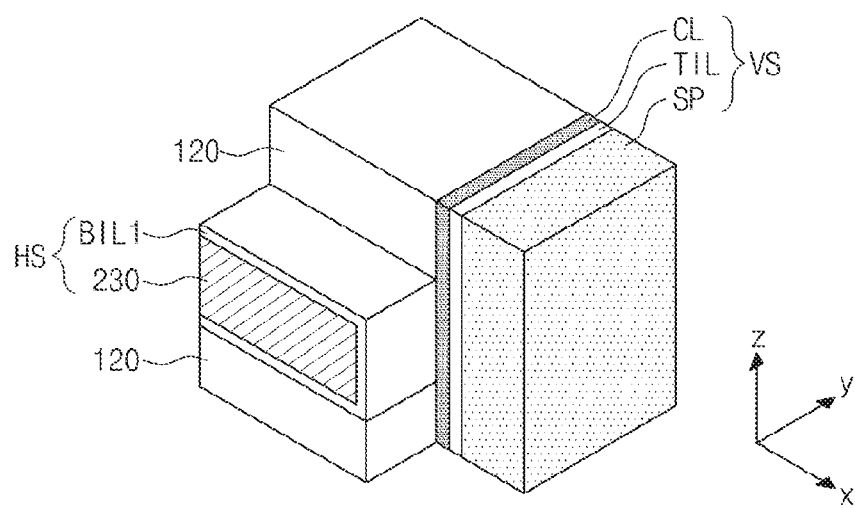
Figure 17C:
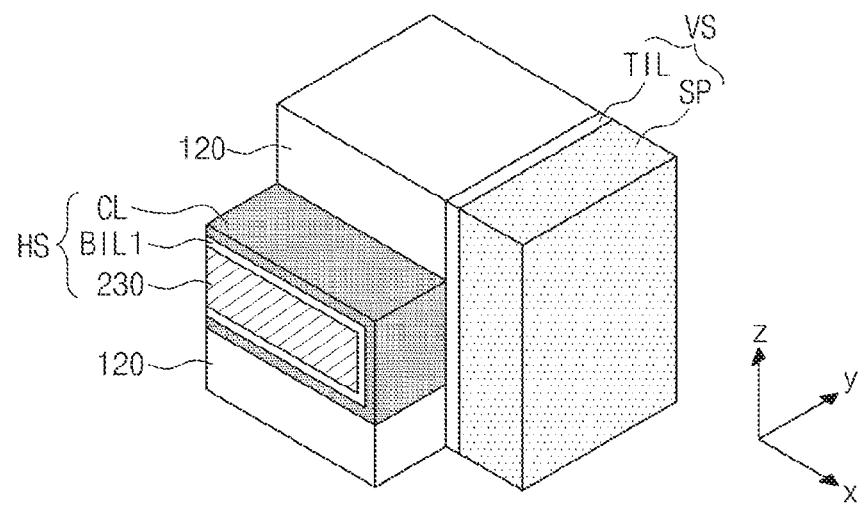

As shown in FIGS. 17A through 17H, a vertical structure VS comprises tunnel insulation layer TIL, and a horizontal structure HS comprises at least one of first and second blocking insulation layers BIL1 and BIL2. In some embodiments, vertical structure VS comprises charge storage layer CL as shown in FIGS. 17A, 17B, 17D, 17F, 17G, and 17H. In other embodiments, horizontal structure HS comprises charge storage layer CL as shown in FIG. 17C. Where vertical structure VS comprises charge storage layer CL, vertical structure VS further comprises capping layer CPL as shown in FIGS. 17A, 17F, 17G, and 17H.

Figure 17D:
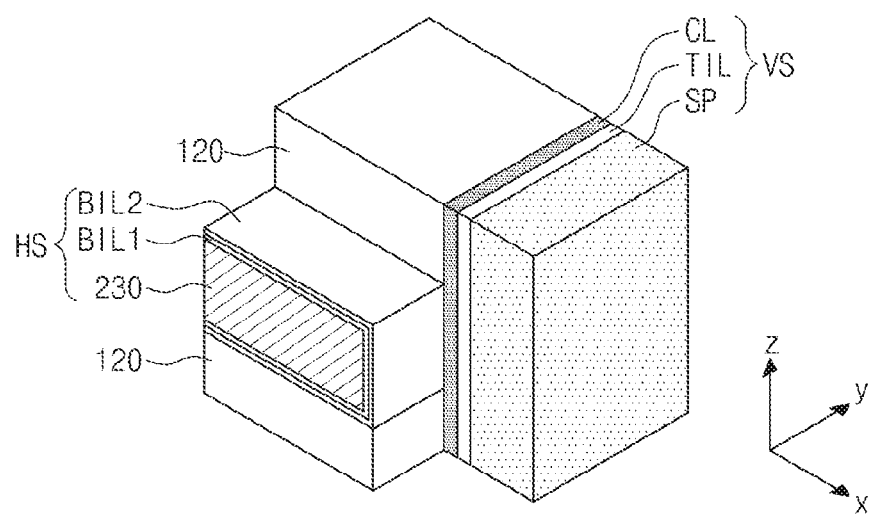

However, as shown in FIGS. 17B, 17C and 17D, vertical structure VS and horizontal structure HS make contact with each other without capping layer CPL.

The sidewall thickness of capping layer CPL may be irregular. For example, when recess regions 210 are formed, the sidewall of capping layer CPL close to horizontal structure HS may be horizontally recessed. In this case, as shown in FIG. 17F, capping layer CPL may be thicker at a region (b) (or vertical adjacent region) between horizontal structures HS than at a region (a) (channel region) close to horizontal structures HS. Alternatively, as shown in FIG. 17G, capping layer CPL may remain locally in the vertical adjacent region (b), and horizontal structure HS may make direct contact with a sidewall of charge storage layer CL in the channel region (a). However, as shown in FIGS. 17A and 17H, the sidewall thickness of capping layer CPL may be substantially uniform.

Figure 17E:
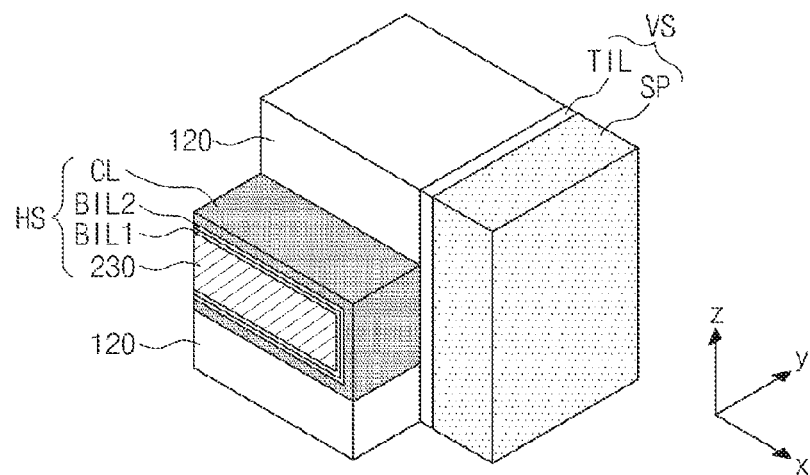
Figure 17F:
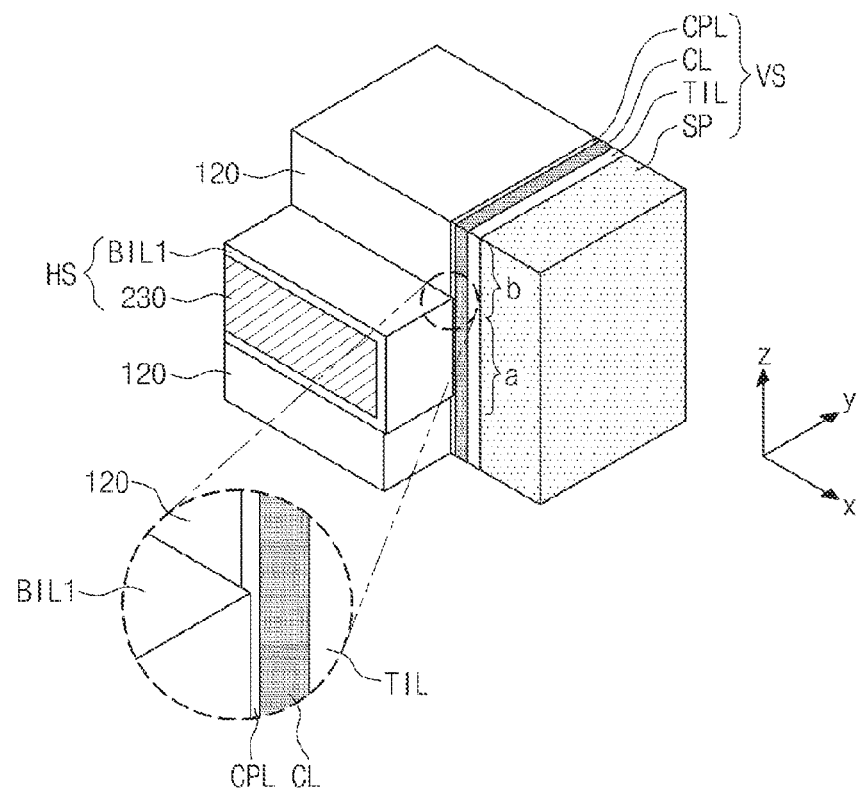
Figure 17G:
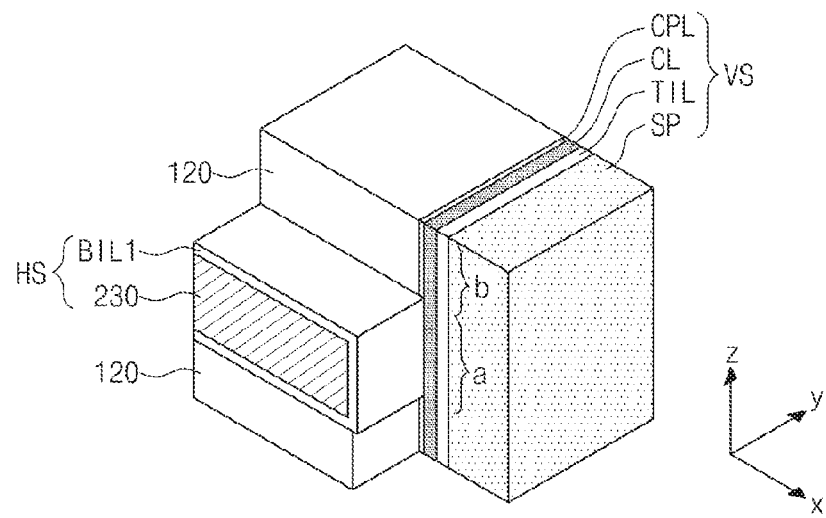
Figure 17H:
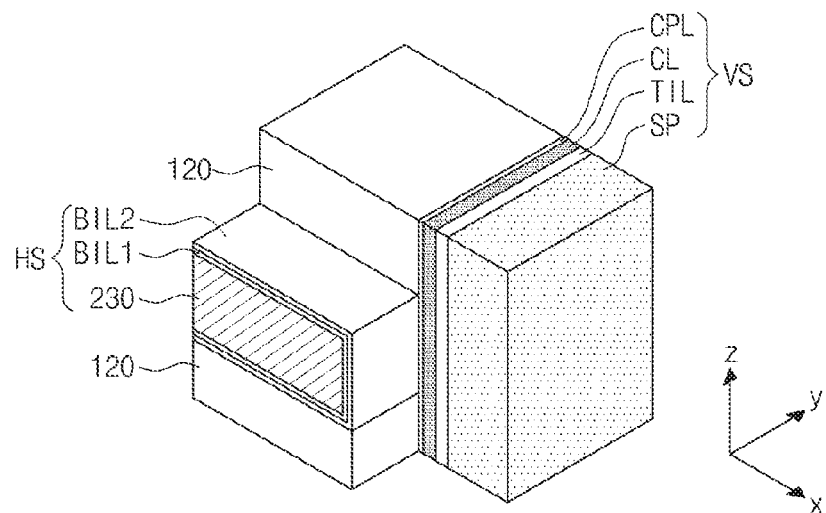

In some embodiments, as shown in FIGS. 17D, 17E, and 17H, horizontal structure HS may include both first and second blocking insulation layers BIL1 and BIL2.

Charge storage layer CL is typically formed of insulation layers having many trap sites, or insulation layers having nanoparticles. Charge storage layer CL is typically formed using CVD or ALD. For example, charge storage layer CL may comprise insulation layers comprising trap insulation layers, floating gate electrodes, or conductive nanodots. Specifically, charge storage layer CL may comprise a silicon nitride layer, a silicon oxynitride layer, a silicon-rich nitride layer, a nanocrystalline silicon layer, or a laminated trap layer.

Tunnel insulation layer TIL comprises a material having a band gap greater than that of charge storage layer CL, and it can be formed by CVD or ALD. For example, tunnel insulation layer TIL can be a silicon oxide layer formed by CVD or ALD. In addition, a predetermined heat treatment process can be further performed on tunnel insulation layer TIL after a deposition process. The heat treatment process can be a rapid thermal nitridation (RTN) process or an annealing process performed under an atmosphere including at least one of nitrogen and oxygen.

First and second blocking insulation layers BIL1 and BIL2 may be formed of different materials. One of the first and second blocking insulation layers BIL1 and BIL2 can be formed of a material having a band gap smaller than that of tunnel insulation layer TIL but greater than that of charge storage layer CL. First and second blocking insulation layers BIL1 and BIL2 can be formed by one of CVD and ALD, and at least one of first and second blocking insulation layers BIL1 and BIL2 may be formed through a wet oxidation process.

In some embodiments, first blocking insulation layer BIL1 comprises a high dielectric constant layer such as an aluminum oxide layer or a hafnium oxide layer, and second blocking insulation layer BIL2 comprises a material having a dielectric constant smaller than that of first blocking insulation layer BIL1. In other embodiments, second blocking insulation layer BIL2 comprises a high dielectric constant layer, and first blocking insulation layer BIL1 comprises a material having a dielectric constant smaller than that of second blocking insulation layer BIL2. In still other embodiments, in addition to first and second blocking insulation layers BIL1 and BIL2, at least one additional blocking insulation layer (not shown) is formed between charge storage layer CL and the conductive pattern 230.

Capping layer CPL comprises a material having etch selectivity with respect to charge storage layer CL or sacrificial layer 130. For example, where sacrificial layer 130 is a silicon nitride layer, capping layer CPL may be a silicon oxide layer. In this case, where sacrificial layers 130 are removed to form recess regions 210, capping layer CPL may function as an etch stop layer for protecting charge storage layer CL from an etching process. As shown in FIGS. 17A, 17F, 17G, and 17H, where capping layer CPL remains between conductive pattern 230 and charge storage layer CL, capping layer CPL comprises a material that can prevent leakage (such as back-tunneling) of a charge stored in charge storage layer CL. For example, capping layer CPL may be one of silicon oxide layers and high dielectric constant layers.

Figure 18A:
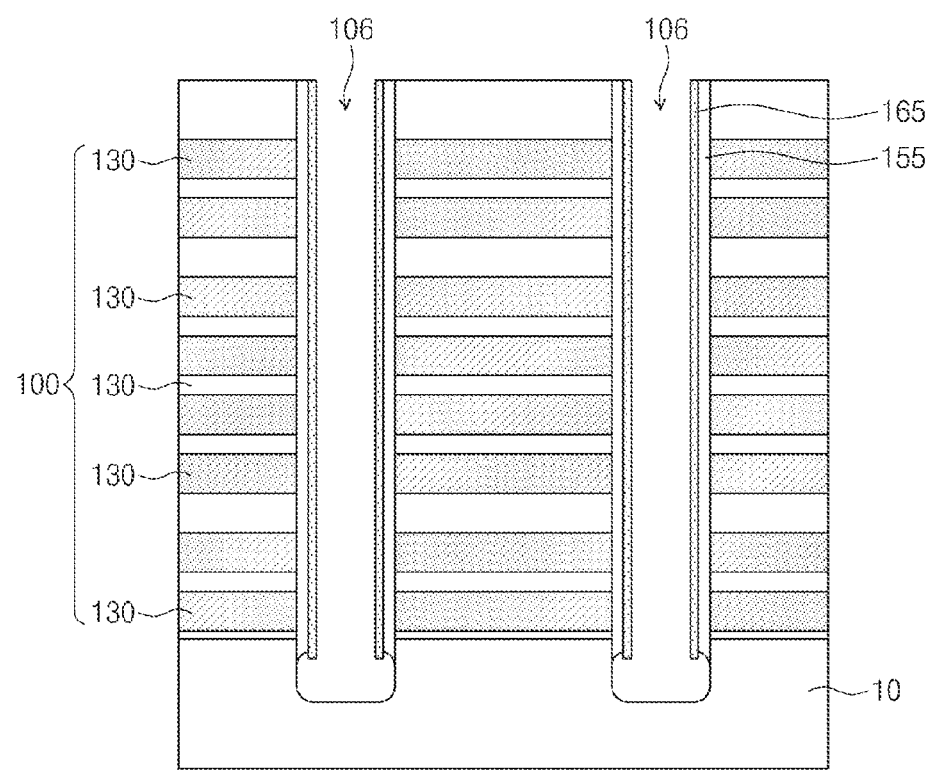
FIGS. 18A through 18C are perspective views for explaining a method of manufacturing a three-dimensional semiconductor memory device according to a second embodiment of the inventive concept.
Figure 18B:
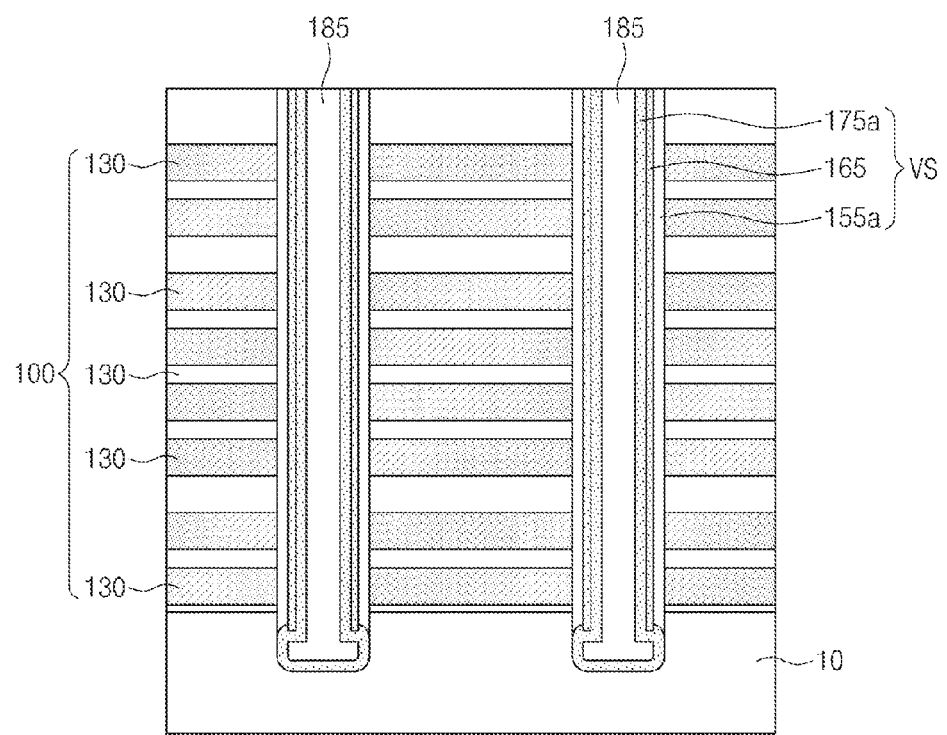
Figure 18C:
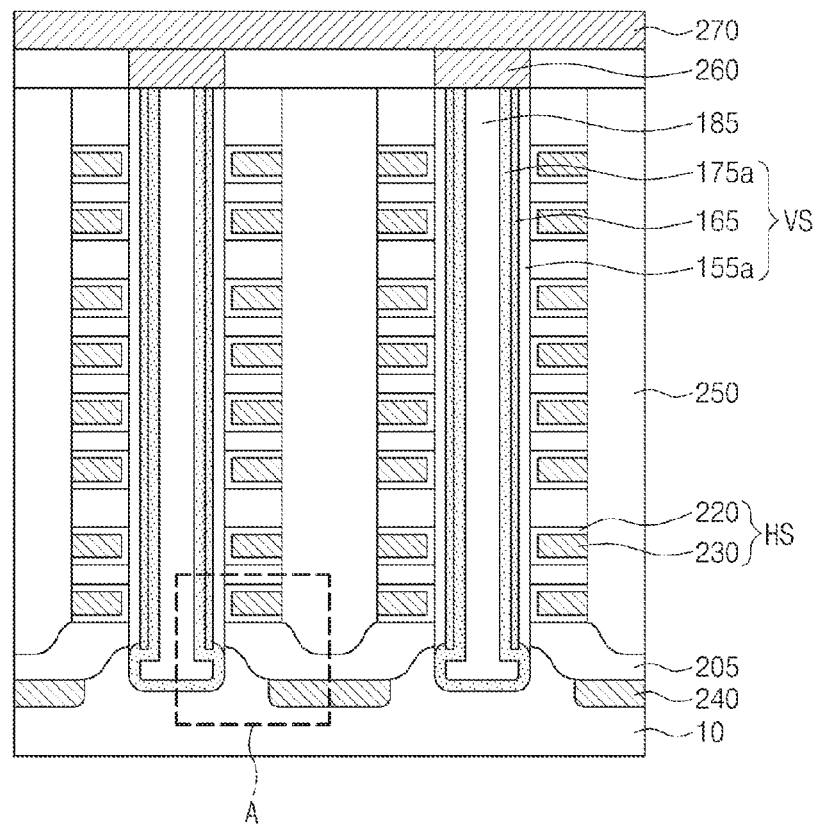
Figure 18D:
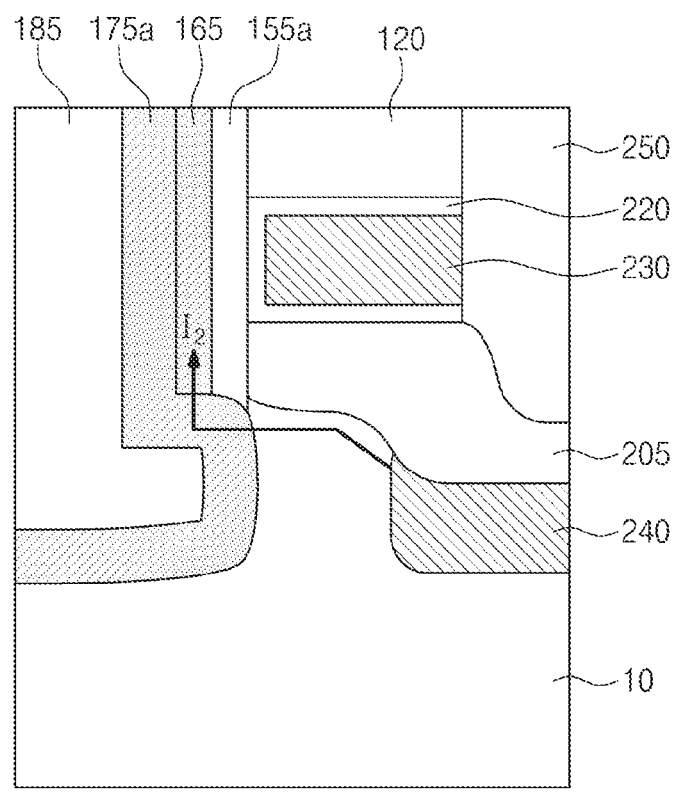
FIG. 18D is an enlarged view illustrating a portion "A" shown in FIG. 18C.

FIGS. 18A through 18C are views for explaining a method of manufacturing a three-dimensional semiconductor memory device according to a second embodiment of the inventive concept. FIG. 18D is an enlarged view illustrating a portion "A" of FIG. 18C. Many features shown in FIGS. 18A through 18D are the same as features described above, so a further description of these features may be omitted for the sake of brevity.

According to the second embodiment, as explained with reference to FIG. 5, semiconductor spacers 165 are formed, and vertical patterns 155 exposed through penetration dents are isotropically etched to form undercuts through which bottom surfaces of semiconductor spacers 165 are exposed. As shown in FIG. 18A, vertical patterns 155 are shorter than semiconductor spacers 165. The bottom surfaces of vertical patterns 155 are disposed between the top surface of substrate 10 and the bottom surfaces of semiconductor spacers 165. Alternatively, the bottom surfaces of vertical patterns 155 may be disposed above the top surface of substrate 10.

As explained with reference to FIG. 5, penetration dents can be formed by anisotropically etching first semiconductor layers 160 and vertical layers 150 so that the top surface of substrate 10 is exposed at the bottom sides of openings 105. The forming of the penetration dents can be performed by a plasma dry etching method using a mold structure 100 as an etch mask.

As a result of the anisotropic etching of first semiconductor layers 160, semiconductor spacers 165 covering inner walls of vertical patterns 155 are formed. The penetration dents penetrate vertical layers 150 covering the bottom sides of openings 105, and thus sidewalls of vertical patterns 155 are exposed through the penetration dents. Vertical patterns 155 have bottom portions between substrate 10 and semiconductor spacers 165 and vertical portions making contact with sidewalls of semiconductor spacers 165. In other words, semiconductor spacers 165 are inserted in the sidewalls of vertical patterns 155, and they are in contact with top surfaces of the bottom portions of vertical patterns 155.

Referring to FIG. 18A, vertical patterns 155 exposed through the penetration dents are isotropically etched to form undercut regions 106 through which the bottom surfaces of semiconductor spacers 165 are exposed.

In some embodiments, exposed charge storage layers CL are isotropically etched to form first undercut regions. The first undercut regions can be cap regions extending from the penetration dents. Surfaces of capping layers CPL and tunnel insulation layers TIL are partially exposed through the first undercut regions.

In some embodiments, charge storage layers CL are silicon nitride layers. In such embodiments, the first undercut regions can be formed by a wet etching process using an etchant containing phosphoric acid. In other embodiments, the first undercut regions may be formed by an isotropic dry etching process.

Capping layers CPL and tunnel insulation layers TIL exposed through the first undercut regions are isotropically etched to form second undercut regions. Parts of the surface of substrate 10, and outer wall lower regions and bottom surfaces of semiconductor spacers 165, which are covered with capping layers CPL and tunnel insulation layers TIL, are exposed through the second undercut regions. The second undercut regions and the first undercut regions form undercut regions 106.

The second undercut regions are formed by at least one of a wet etching method and an isotropic dry etching method. In the case of the wet etching method, an etchant containing hydrofluoric acid or a sulfuric acid may be used.

Referring to FIG. 18B, second semiconductor layers 175a connecting substrate 10 and semiconductor spacers 165 are formed in undercut regions 106. Second semiconductor layers 175a are semiconductor layers, such as polycrystalline silicon layers, formed by deposition. As shown in FIG. 18B, second semiconductor layers 175a extend from undercut regions 106 and cover the inner walls of semiconductor spacers 165. As a result of a deposition process, second semiconductor layers 175a may have seams in undercut regions 106.

In some embodiments, the forming of undercut regions 106 comprises isotropically etching capping layers CPL and tunnel insulation layers TIL as shown in FIG. 17A.

Capping layers CPL and tunnel insulation layers TIL are etched by at least one of a wet etching method and an isotropic dry etching method. In the wet etching method, an etchant containing hydrofluoric acid or sulfuric acid may be used. The bottom surfaces of charge storage layers CL may be more distant from the bottom surfaces of openings 105 than the bottom surfaces of capping layers CPL and/or tunnel insulation layers TIL. Alternatively, if charge storage layers CL are first etched, the bottom surfaces of capping layers CPL and/or tunnel insulation layers TIL may be more distant from the bottom surfaces of openings 105 than the bottom surfaces of charge storage layers CL.

Due to the enlarged undercut regions 106, the height difference between the bottom surfaces of vertical patterns 155 and the bottom surfaces of semiconductor spacers 165 may be reduced as in the embodiment explained with reference to FIGS. 13A and 13B. The enlarged undercut regions 106 may facilitate uniform forming of second semiconductor layers 175a on the inner walls of undercut regions 106. In addition, due to the enlargement of undercut regions 106, voids may be formed in undercut regions 106 after second semiconductor layers 175a are formed.

In some embodiments, undercut regions 106 are formed in a manner such that the penetration dents penetrate vertical layers 150 to expose the top surface of substrate 10. In this case, the top surface of substrate 10 exposed through the penetration dents may be etched when the enlarged undercut regions 106 are formed, and thus the penetration dents may be enlarged under vertical patterns 155. Voids are formed in second semiconductor layers 175a. The voids may include upper voids at undercut regions 106 and lower voids at the enlarged penetration dents. In certain modified embodiments, the voids are completely or partially filled with an insulation material, such as a silicon oxide.

In certain modified embodiments, after second semiconductor layers 175a are formed, a recrystallization process is further performed on semiconductor spacers 165 and second semiconductor layers 175a. The recrystallization process reduces the density of crystalline defects in semiconductor spacers 165 and second semiconductor layers 175a. For example, where semiconductor spacers 165 and second semiconductor layers 175a are polycrystalline silicon layers, the recrystallization process may increase grain sizes of semiconductor spacers 165 and second semiconductor layers 175a or change the crystalline structure of semiconductor spacers 165 and second semiconductor layers 175a into a single crystalline structure. The recrystallization process may be performed using a heat treatment technique, laser annealing technique, or epitaxial technique. Where substrate 10 is a single crystalline wafer, the average crystalline defects of substrate 10 may be fewer than the average crystalline defects of semiconductor spacers 165 and second semiconductor layers 175a.

In the second embodiment, semiconductor patterns comprise penetration portions inserted in vertical patterns 155, and insertion portions extending from the penetration portions to make direct contact with substrate 10 and having a width greater than that of the penetration portions. The penetration portions of the semiconductor patterns comprise semiconductor spacers 165 and second semiconductor layers 175a, and the insertion portions of the semiconductor patterns make direct contact with substrate 10 at recess regions. The bottom surfaces of vertical patterns 155 make contact with the insertion portions of the semiconductor patterns. The thickness of the penetration portions of the semiconductor patterns may be greater than the insertion portions of the semiconductor patterns.

Next, as explained with reference to FIG. 8, trenches 200 are formed through mold structure 100 to expose sidewalls of sacrificial layers 130 and insulation layers 120. As explained with reference to FIG. 9, sacrificial layers 130 exposed through trenches 200 are selectively removed to form recess regions 210 between insulation layers 120.

Referring to FIG. 18C, as explained with reference to FIGS. 10 and 13A, a resultant structure including recess regions 210 is oxidized to form lower oxide layers 205 on substrate 10 under recess regions 210 and trenches 200. Lower oxide layers 205 formed by consuming substrate 10 cover sidewalls of vertical patterns 155.

Next, as explained with reference to FIG. 10, horizontal structures HS are formed to fill recess regions 210. Horizontal structures HS comprise horizontal patterns 220 covering inner walls of recess regions 210, and conductive patterns 230 filling remaining spaces of recess regions 210. In some embodiments, after forming conductive patterns 230, impurity regions 240 are further formed. Next, electrode separation patterns 250 are formed to fill trenches 200, or metal patterns 255 are formed to electrically connect impurity regions 240 as explained with reference to FIG. 14.

Upper plugs 260 are formed on top sides of vertical structures VS, respectively, and upper interconnections 270 are formed on top sides of upper plugs 260 to connect upper plugs 260.

Referring to FIGS. 18C and 18D, in the three-dimensional semiconductor memory device of the second embodiment, the semiconductor patterns comprise penetration portions inserted in vertical patterns 155. The insertion portions extend from the penetration portions to make direct contact with substrate 10, and they have a width greater than that of the penetration portions. The penetration portions of the semiconductor patterns comprise semiconductor spacers 165 and second semiconductor layers 175a, and the insertion portions of the semiconductor patterns make direct contact with substrate 10 at recess regions 210. The bottom surfaces of vertical patterns 155 make contact with the insertion portions of the semiconductor patterns. The thickness of the penetration portions of the semiconductor patterns is greater than the insertion portions of the semiconductor patterns.

In the second embodiment, lower oxide layers 205 make contact with parts of the sidewalls of vertical patterns 155 inserted in substrate 10. In addition, lower oxide layers 205 are indirectly contact with parts of second semiconductor layers 175a extending under conductive patterns 230.

In the second embodiment, because second semiconductor layers 175a are close to the lowermost conductive patterns 230 owing to undercut regions 106, a current path $I_2$ can be closer to the lowermost conductive patterns 230 as compared with current path $I_1$ explained with reference to FIGS. 13A and 13D.

Figure 19:
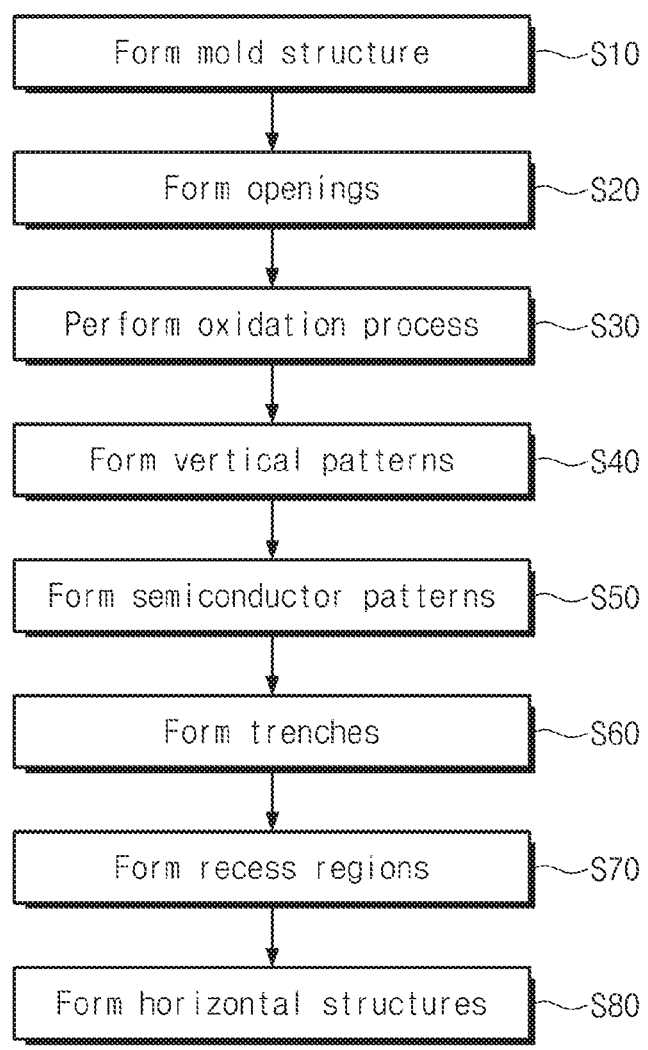
FIG. 19 is a flowchart for explaining a method of manufacturing a three-dimensional semiconductor memory device according to a third embodiment of the inventive concept.

FIG. 19 is a flowchart for explaining a method of manufacturing a three-dimensional semiconductor memory device according to a third embodiment of the inventive concept. FIGS. 20A through 20H are perspective views for explaining the method of manufacturing a three-dimensional semiconductor memory device according to the third embodiment of the inventive concept. Many features shown in FIGS. 19 and 20 are the same as features described above, so a further description of these features may be omitted for the sake of brevity.

Referring to FIG. 19, the three-dimensional semiconductor memory device manufacturing method of the third embodiment comprises forming a mold structure 100 on a substrate 10 as described with reference to FIG. 2 (S10), forming openings 105 through mold structure 100 as described with reference to FIG. 3 (S20), forming vertical patterns 155 to cover inner walls of the respective openings 105 as described with reference to FIGS. 4 and 5 (S40), forming semiconductor patterns respectively in openings 105 in which vertical patterns 155 are formed as described with reference to FIGS. 6 and 7 (S50), forming trenches 200 through mold structure 100 to expose sacrificial layers 130 and insulation layers 120 as described with reference to FIG. 8 (S60), forming recess regions 210 between insulation layers 120 by selectively removing sacrificial layers 130 exposed through trenches 200 as described with reference to FIG. 9 (S70), and forming horizontal structures HS to fill recess regions 210 as described with respect to FIG. 10 (S80).

In the third embodiment, an oxidation process S30 is further performed before vertical patterns 155 are formed. This oxidizes surfaces of penetration dents 103 having sidewalls and bottoms extending from openings 105 so that corners (C) of substrate 10 are rounded.

Figure 20A:
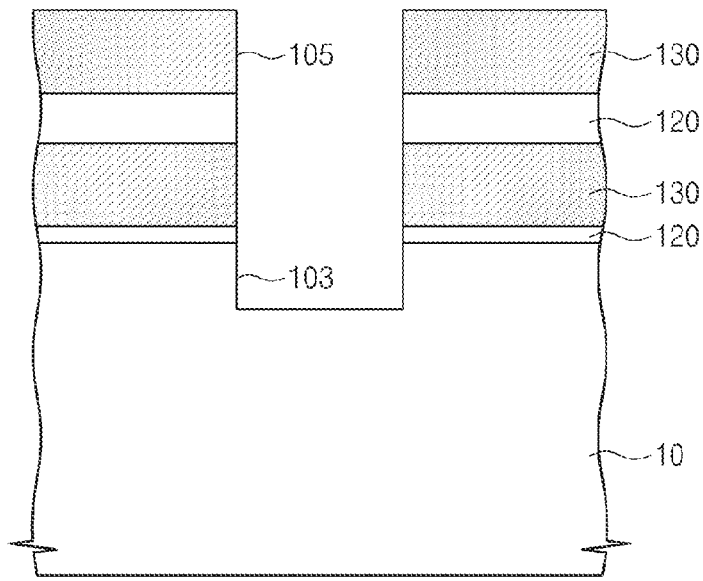
FIGS. 20A through 20H are perspective views for explaining the method of FIG. 19.

Referring to FIGS. 3 and 20A, if mold structure 100 is directly formed on substrate 10, the top surface of substrate 10 may be exposed through openings 105. Furthermore, as a result of over-etch during anisotropic etching, substrate 10 is recessed from opening 105 to a predetermined depth as shown in FIG. 20A. As a result, penetration dent 103 having sidewalls and a bottom surface extending from opening 105 is locally formed in substrate 10. Furthermore, penetration dent 103 formed in substrate 10 contributes to improving structural stability of vertical structure VS.

Figure 20B:
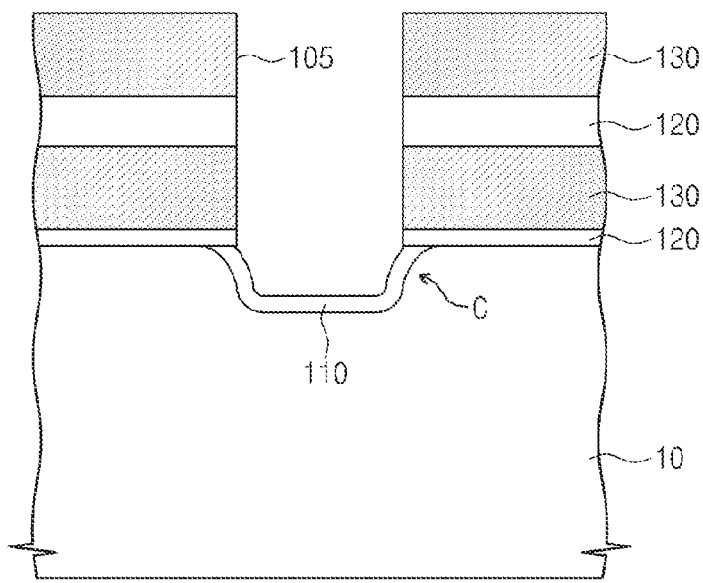

Referring to FIG. 20B, a rounded profile is formed between the sidewalls of penetration dent 103 and the top surface of substrate 10. That is, corners (C) of substrate 10 disposed between mold structure 100 and the sidewalls of penetration dent 103 are rounded. Because the corners (C) of substrate 10 are rounded, the distance between the bottom surface of the lowermost sacrificial layer 130 and the top surface of substrate 10 increases as it approaches opening 105.

In some embodiments, oxidation process S30 is performed to round the corners (C) of substrate 10 by oxidizing the surface of penetration dent 103 formed in substrate 10. More specifically, in oxidation process S30, oxygen atoms react with silicon atoms of substrate 10, and thus a silicon oxide layer is formed on the inner wall of penetration dent 103. In other embodiments, a pre-cleaning process is performed using an etchant containing a hydrofluoric acid before oxidation process S30. In this case, a part of insulation layer 120 disposed between the sacrificial layer 130 and substrate 10 is etched, and thus portions of the top surface of substrate 10 extending from the sidewalls of penetration dent 103 are exposed.

A thermal oxidation process or a radical oxidation process is performed as oxidation process S30. The thermal oxidation process can be a dry oxidation process using oxygen or a wet oxidation process using steam as an oxidant. The thermal oxidation process can be performed by a wet oxidation method with a rapid reaction rate and good layer quality. The radical oxidation process is typically performed by generating oxygen radicals by activating oxygen source gas to cause reaction between the oxygen radicals and silicon. Because reaction of oxygen radicals is fast in the radiation oxidation process, a silicon oxide layer may be rapidly formed by using the radical oxidation process.

Gases such as $O_2$ gas, $H_2O$ gas (steam), a mixture of $H_2$ gas and $O_2$ gas, $H_2$ gas, and a mixture of $Cl_2$ gas and $O_2$ gas can be used as a source gas in the oxidation process S30. Oxidation process S30 is typically performed at a pressure of about 1 mTorr to about 50 mTorr and a temperature of about 600° C. to about 1100° C. By the oxidation process S30, a silicon oxide layer having a thickness of about 10 Å to about 100 Å is formed on the inner wall of penetration dent 103.

Where the surface of substrate 10 exposed through penetration dent 103 reacts with oxygen atoms in oxidation process S30, a bird's beak shape may be formed at the corners (C) of substrate 10 with sharp edges. Accordingly, the profile of upper parts of the corners (C) may be rounded. In addition, because the silicon oxide layer is formed in oxidation process S30 while consuming silicon atoms from the surface of substrate 10, the sidewalls and bottom surface of penetration dent 103 may be recessed. In addition, as a result of oxidation process S30, a layer comprising oxygen atoms may be formed on the inner wall of opening 105 as well as the inner wall of penetration dent 103. Furthermore, the surface of substrate 10 damaged during an etching process for forming penetration dent 103 may be cured by oxidation process S30.

In some embodiments, the upper corners (C) of substrate 10 can be rounded by an etching process instead of an oxidation process.

Figure 20C:
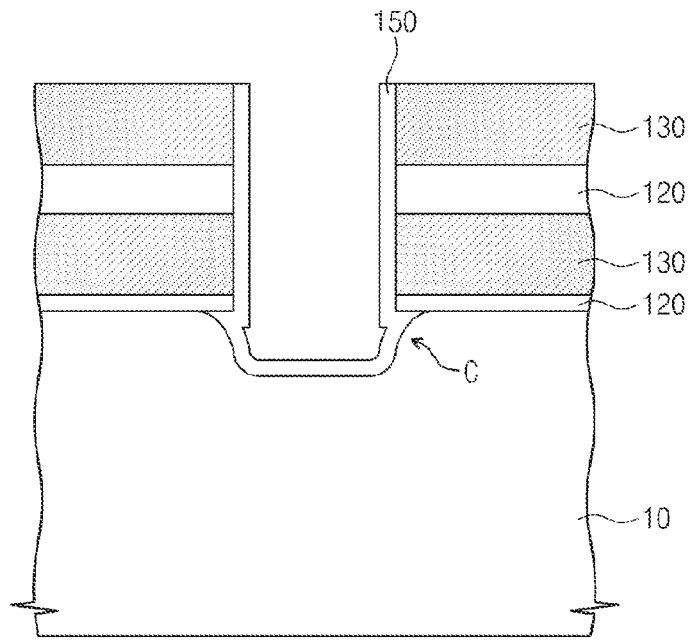

Next, referring to FIGS. 4, 5, and 20C, vertical patterns 155 are formed in openings 105. As described with reference to FIGS. 4 and 5, the forming of vertical patterns 155 comprises forming vertical layers 150 to uniformly cover mold structure 100 where openings 105 are formed, forming semiconductor spacers 165 to cover inner walls of vertical layers 150, and anisotropically etching vertical layers 150 to expose the top surface of substrate 10 through the penetration dents 103.

Before forming vertical patterns 155 in openings 105, the silicon oxide layers formed on penetration dents 103 are removed. For example, the silicon oxide layers can be removed by a wet etching process using a mixture solution of $NH_4OH$ and HF, a diluted HF solution, or an LAL solution containing $NH_4F$, HF, and $H_2O$. After the silicon oxide layers are removed, the rounded upper corners (C) of substrate 10 are exposed, and the sidewalls and bottom surfaces of the penetration dents 103 are exposed. The upper corners (C) of substrate 10 are disposed under mold structure 100, and a gap is formed between the rounded upper corners (C) of substrate 10 and mold structure 100.

Referring to FIG. 20C, vertical layer 150 and a first semiconductor layer formed on the inner walls of opening 105 and penetration dent 103 may be substantially uniform. As shown in FIG. 20C, the total thickness of vertical layer 150 and the first semiconductor layer may be less than half the width of opening 105. That is, opening 105 may be not completely filled with vertical layer 150 and the first semiconductor layer. In some embodiments, the gap between mold structure 100 and the rounded upper corners (C) of substrate 10 may be filled with vertical layer 150 as shown in FIG. 20C.

Figure 20D:
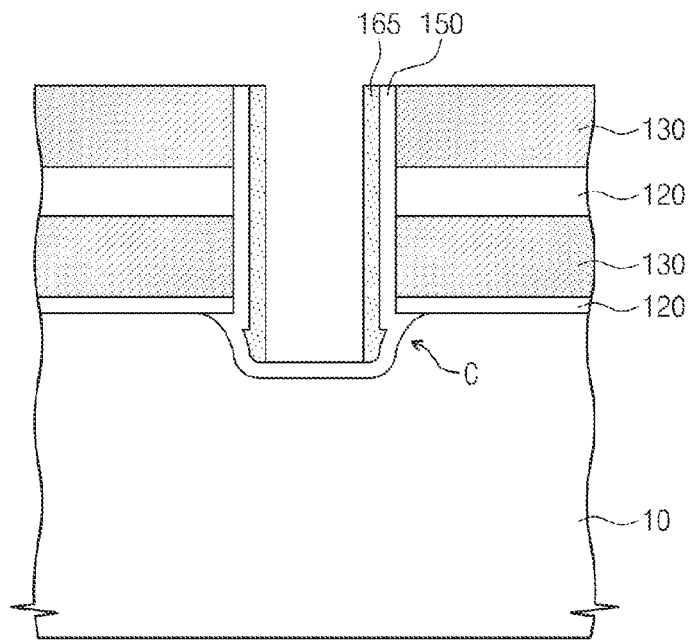

Next, referring to FIGS. 5 and 20D, the first semiconductor layer is anisotropically etched to form a semiconductor spacer 165 covering the inner wall of vertical layer 150. The forming of the semiconductor spacer 165 comprises forming the first semiconductor layer uniformly on a resultant structure including vertical layer 150, and anisotropically etching the first semiconductor layer to expose vertical layer 150.

Figure 20E:
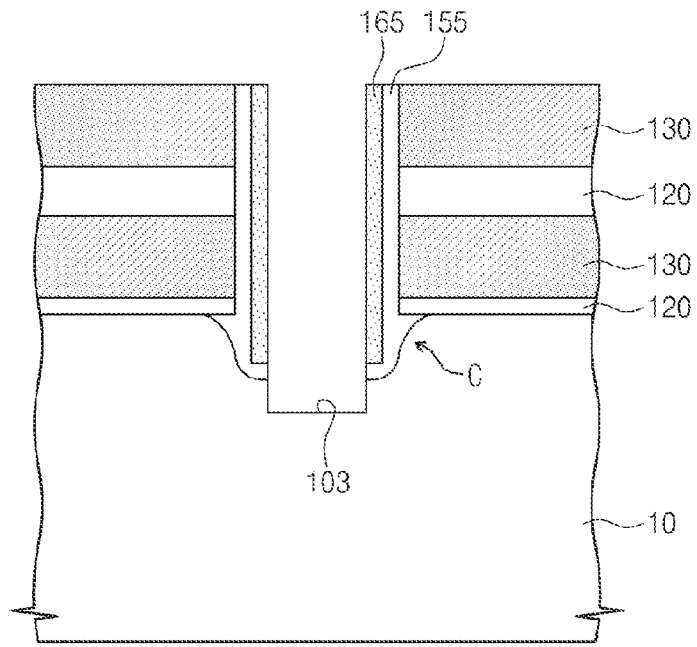

Next, vertical layer 150 is anisotropically etched using the semiconductor spacer 165 to form vertical pattern 155 having a cylindrical shape with opened both ends as shown in FIG. 5. Semiconductor spacer 165 is disposed in vertical pattern 155 to expose substrate 10. Furthermore, as a result of over-etch during the anisotropic etching process of vertical layer 150, the bottom surface of penetration dent 103 exposed through semiconductor spacer 165 is recessed as shown in FIG. 20E.

Alternatively, during the anisotropic etching process, a portion of vertical layer 150 disposed at the lower side of semiconductor spacer 165 may not be etched. In this case, vertical pattern 155 may include a bottom portion disposed between the bottom surface of semiconductor spacer 165 and the top surface of substrate 10.

Figure 20F:
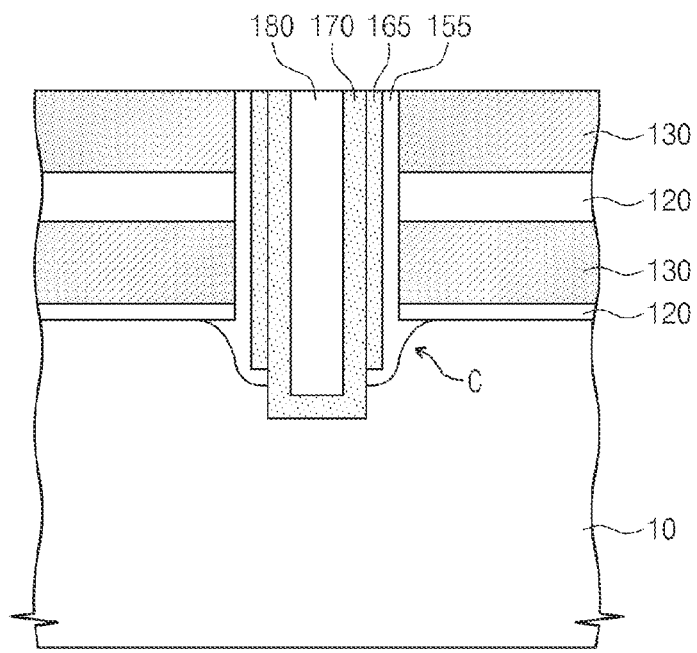

Referring to FIGS. 6, 7, and 20F, semiconductor patterns are formed in openings 105 where vertical patterns 155 are formed. As described with reference to FIGS. 6 and 7, the forming of the semiconductor patterns can comprise sequentially forming second semiconductor layers 170 and buried insulation layers 180 in openings 105 where vertical patterns 155 and semiconductor spacers 165 are formed.

Next, as described with reference to FIGS. 8 through 12, trenches 200 are formed through mold structure 100 to expose sacrificial layers 130 and insulation layers 120, sacrificial layers 130 exposed through trenches 200 are selectively removed to form recess regions 210 between insulation layers 120, horizontal structures HS are formed to fill recess regions 210, electrode separation patterns 250 are formed to fill trenches 200, and upper plugs 260 and upper interconnections 270 are formed in a manner such that the upper plugs 260 and upper interconnections 270 are electrically connected to vertical structures VS.

Figure 20G:
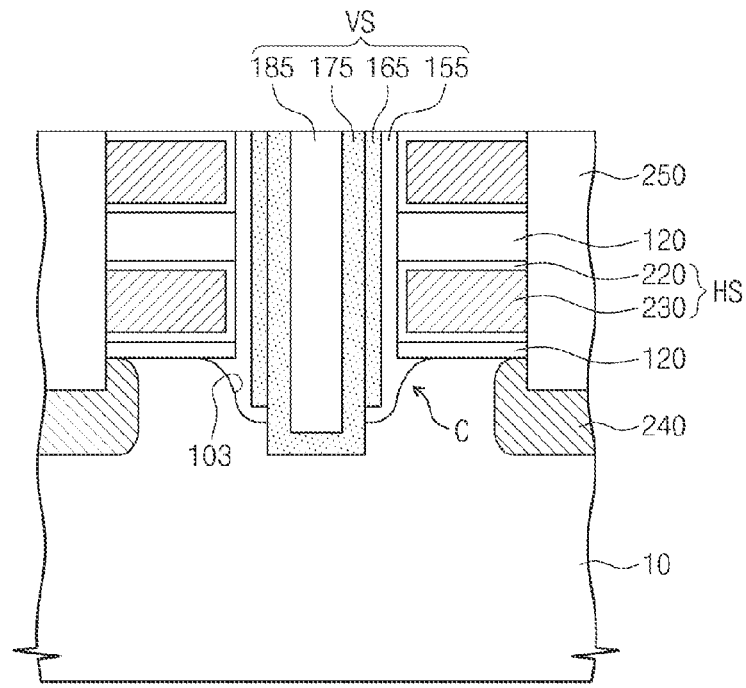

Referring to FIG. 20G, in a three-dimensional semiconductor memory device according to the third embodiment, penetration dents 103 having sidewalls and bottom surfaces are defined at predetermined regions of substrate 10. In some embodiments, the upper width of penetration dent 103 formed in substrate 10 is greater than the width of the semiconductor pattern (165, 175). The width of penetration dent 103 decreases monotonically as it goes downward.

The slope of the sidewall profile of penetration dent 103 is varied along the depth of penetration dent 103. For example, the same slope is measured at different positions of the sidewall profile of penetration dent 103 from the top surface of substrate 10. The slope of the sidewall profile can be expressed by the ratio of width variation to depth variation of penetration dent 103. Substrate 10 may have rounded surfaces between its top surface and the sidewalls of penetration dent 103. In other words, the rounded upper corners (C) of substrate 10 may be located between the sidewalls of penetration dent 103 and the lowermost conductive patterns 230.

A semiconductor body 175 penetrates conductive patterns 230 stacked on substrate 10 and is inserted in penetration dent 103 of substrate 10 for direct contact with substrate 10.

Figure 20H:
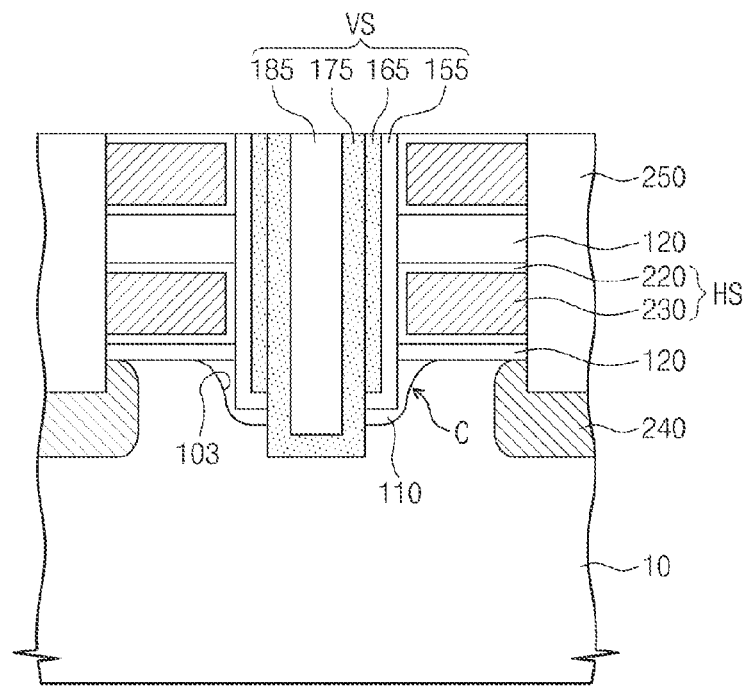

Vertical pattern 155 disposed between semiconductor patterns (165, 175) and conductive patterns 230 extends to the sidewalls of penetration dent 103 to cover the rounded upper corners (C) of substrate 10. In some embodiments, as shown in FIG. 20H, an oxidation process is performed to form a silicon oxide layer 110 between the vertical pattern 155 and the sidewalls of penetration dent 103.

In some embodiments, a dielectric layer is disposed between the bottom surface of the lowermost conductive pattern 230 and the top surface of substrate 10. The dielectric layer comprises a first portion close to semiconductor patterns 165 and 175, and a second portion spaced apart from semiconductor patterns 165 and 175. The first portion of the dielectric layer is a portion of vertical pattern 155, and the second portion of the dielectric layer is a portion of lowermost insulation layer 120. Because substrate 10 has rounded upper corners (C) close to semiconductor patterns 165 and 175, the first portion of the dielectric layer is thicker than the second portion of the dielectric layer. In other words, the thickness of the dielectric layer measured between the bottom surface of the lowermost conductive pattern 230 and the top surface of substrate 10 is increased as it approaches semiconductor layers 165 and 175.

In some embodiments, in order to form a current path between an impurity region 240 and an upper interconnection, an inversion region is continuously formed in substrate 10 and semiconductor patterns 165 and 175 by a voltage applied to conductive patterns 230. However, because the vertical pattern 155, which functions as a data storage layer, penetrates conductive patterns 230 stacked on substrate 10 and is inserted in penetration dent 103 of substrate 10, an electric field applied from the lowermost conductive pattern 230 to lower regions of semiconductor patterns 165 and 175 is weakened. In this case, the current path may be cut off at portions of semiconductor patterns 165 and 175 disposed in penetration dent 103.

However, according to certain embodiments, due to the rounded upper corners (C) of substrate 10 disposed between sidewalls of the vertical pattern 155 and the bottom surface of the lowermost conductive pattern 230, a thick dielectric layer is formed between the sidewalls of vertical pattern 155 inserted in penetration dent 103 of substrate 10 and the bottom surface of the lowermost conductive pattern 230. This prevents weakening of an electric field applied from the lowermost conductive pattern 230 to the lower regions of semiconductor patterns 165 and 175. Therefore, when the semiconductor memory device is operated, an inversion region formed in substrate 10 and semiconductor patterns 165 and 175 is not cut off.

Figure 21:
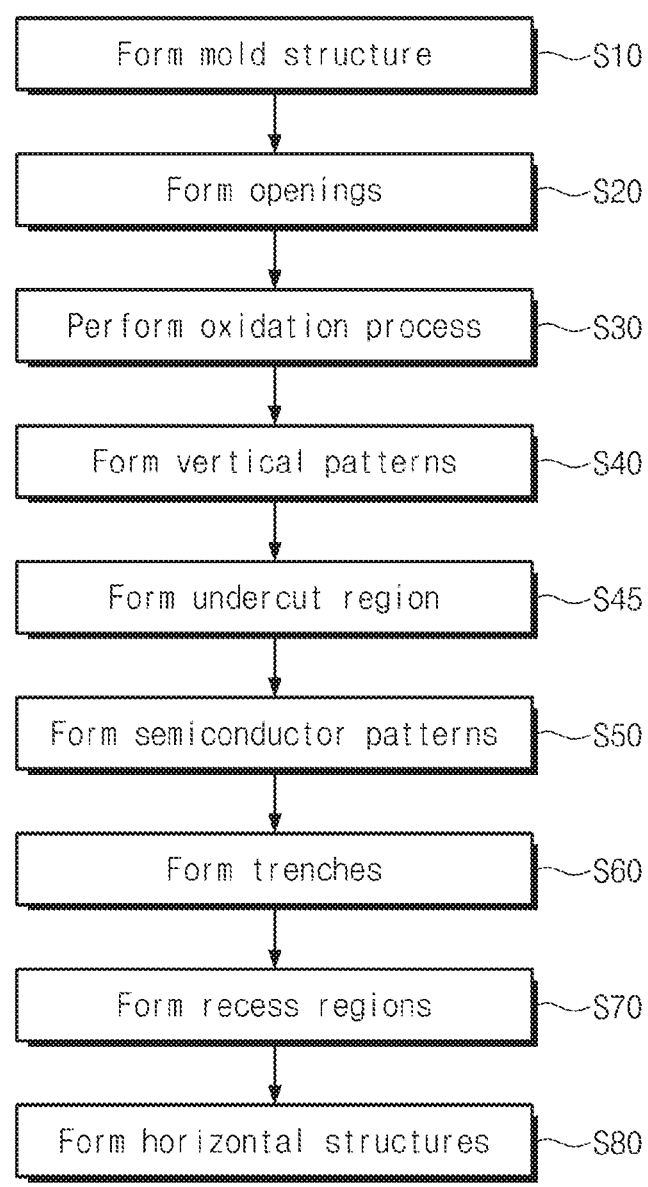
FIG. 21 is a flowchart for explaining a method of manufacturing a three-dimensional semiconductor memory device according to a fourth embodiment of the inventive concept.

FIG. 21 is a flowchart for explaining a method of manufacturing a three-dimensional semiconductor memory device according to a fourth embodiment of the inventive concept. FIGS. 22A through 22D are sectional views for explaining the method of manufacturing a three-dimensional semiconductor memory device according to the fourth embodiment of the inventive concept. FIGS. 22A through 22D illustrate a lower region of the three-dimensional semiconductor memory device of the fourth embodiment.

As shown in FIG. 21, the three-dimensional semiconductor memory device manufacturing method of the fourth embodiment comprises forming an undercut region by removing a bottom portion of a vertical pattern 155 (S45) after the vertical pattern 155 is formed but a semiconductor pattern is formed. Otherwise, the method includes steps similar to those illustrated in FIG. 19.

Figure 22A:
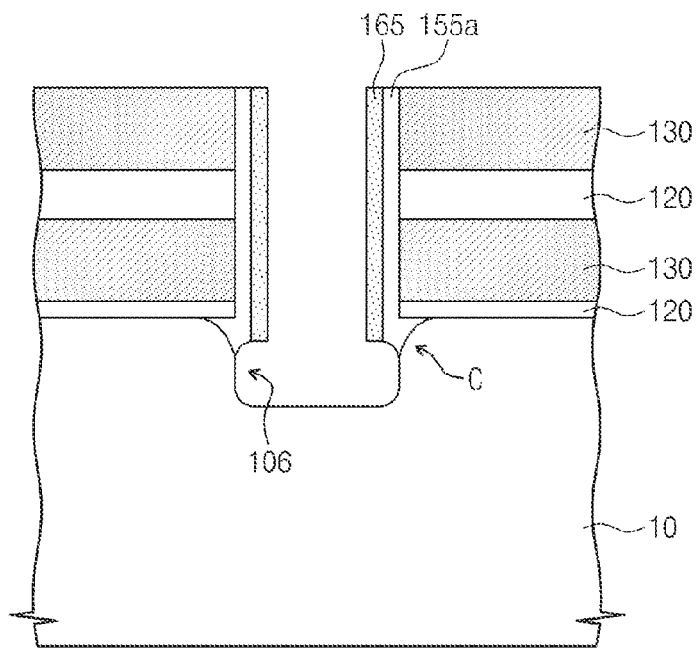
FIGS. 22A through 22D are sectional views for explaining the method of FIG. 21.

In the method of FIG. 21, semiconductor spacer 165 is formed to cover the sidewall of vertical pattern 155, and vertical pattern 155 exposed through penetration dent 103 is isotropically etched to form an undercut 106 through which the bottom surface of semiconductor spacer 165 is exposed. First, as was shown in and described with reference to FIGS. 20A-20D, a vertical layer 150 is shorter than semiconductor spacer 165. The bottom of vertical layer 150 is disposed between the top surface of a substrate 10 and the bottom surface of the semiconductor spacer 165. Alternatively, the bottom surface of vertical layer 150 may be disposed above the top surface of substrate 10. Then undercut region 106 is formed, as shown in FIG. 22A, thereby forming vertical pattern 155a from vertical layer 150.

The forming of undercut region 106 typically comprises isotropically etching a plurality of layers constituting the vertical pattern 155a. In some embodiments, vertical pattern 155a comprise a data storage layer, and the data storage layer comprises tunnel insulation layer TIL, charge storage layer CL, and capping layer CPL as shown in FIG. 17A.

In some embodiments, the forming of undercut region 106 comprises forming a first undercut region by isotropically etching the exposed charge storage layer CL, and forming a second undercut region by isotropically etching the capping layer CPL and tunnel insulation layer TIL exposed through the first undercut region.

In some embodiments, as described with reference to FIG. 20B, a silicon oxide layer 110 formed on penetration dent 103 of substrate 10 is not removed, and vertical pattern 155a and semiconductor spacer 165a is formed on silicon oxide layer 110. In such embodiments, as shown in FIG. 22D, where undercut region 106 is formed, portions of silicon oxide layer 110 are isotropically etched.

Figure 22B:
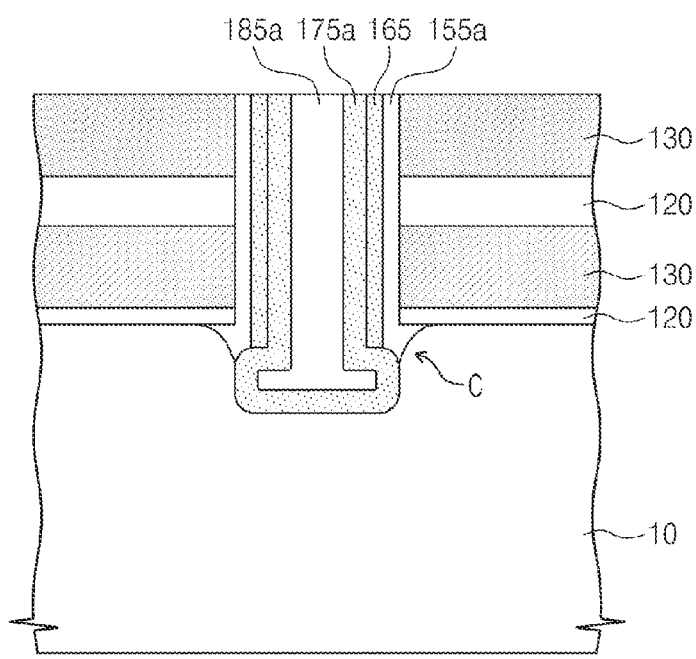

Next, referring to FIG. 22B, a second semiconductor layer 175a is formed in undercut region 106 to connect semiconductor spacer 165 and substrate 10. Second semiconductor layer 175a can be a semiconductor layer, such as a polycrystalline silicon layer, formed by a deposition method. As shown in FIG. 22B, second semiconductor layer 175a extends from undercut region 106 and covers the inner wall of semiconductor spacer 165. Due to the deposition process, second semiconductor layer 175a has a seam in undercut region 106.

In another embodiment, a void is formed in undercut region 106 because undercut region 106 is not completely filled with second semiconductor layer 175a. In other embodiments, the void can be completely or partially filled with an insulation material, such as a silicon oxide. Next, as described with reference to FIGS. 8 through 12, horizontal structures HS are three-dimensionally arranged on substrate 10.

Figure 22C:
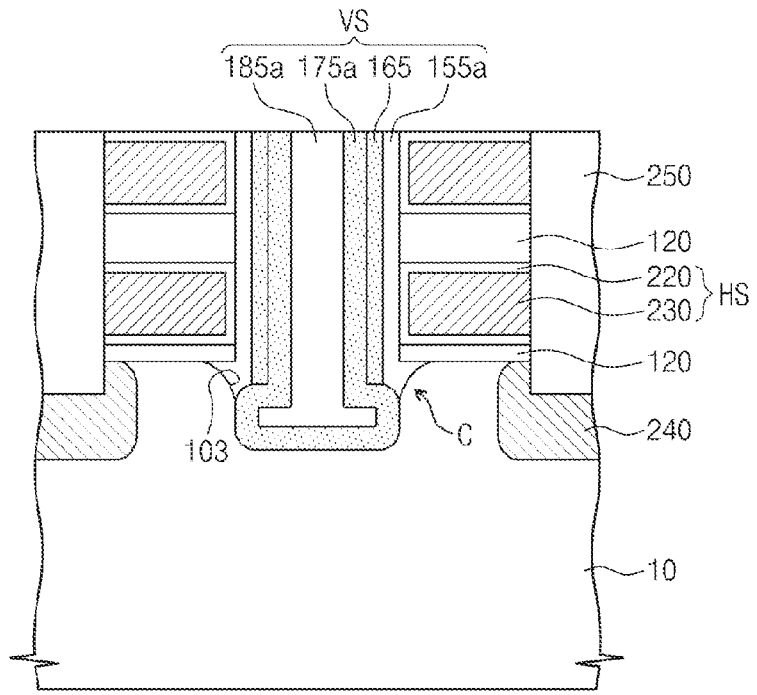
Figure 22D:
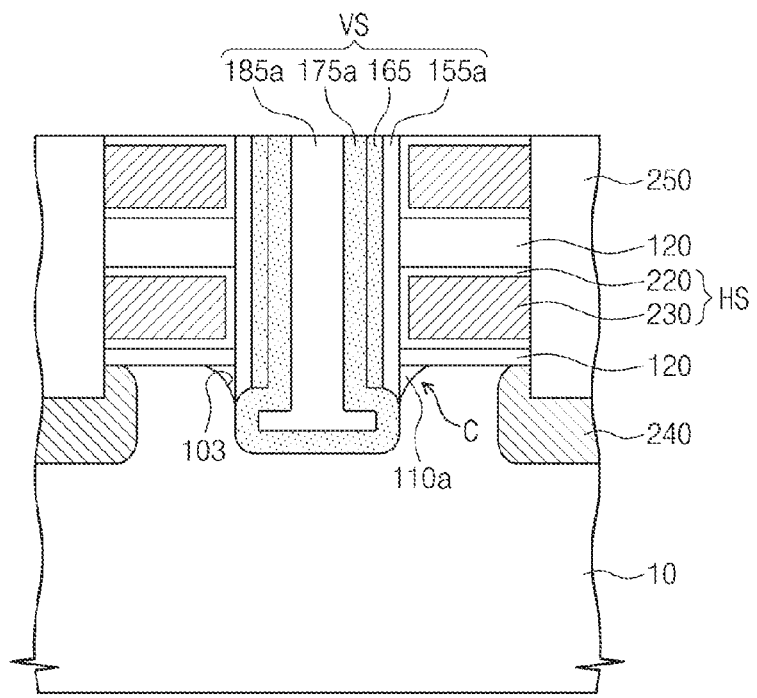

Referring to FIGS. 22C and 22D, in the three-dimensional semiconductor memory device of the fourth embodiment, horizontal structures HS are three-dimensionally arranged on substrate 10 as described above, and vertical structures VS vertically penetrating horizontal structures HS are two-dimensionally arranged on substrate 10. Each of horizontal structures HS comprises a conductive pattern 230 and a horizontal pattern 220. Each of vertical structures VS comprises semiconductor patterns 165 and 175a connected to the top surface of substrate 10, and vertical pattern 155 disposed between semiconductor patterns 165 and 175a and horizontal structures HS.

In some embodiments, substrate 10 comprises penetration dent 103 having sidewalls and a bottoms surface. The upper width of penetration dent 103 is greater than the width of semiconductor patterns 165 and 175a. The width of penetration dent 103 is monotonically decreased as it goes downward. The slope of the sidewall profile of penetration dent 103 is varied along the depth of penetration dent 103. For example, the same slope may be measured at different positions of the sidewall profile of penetration dent 103 from the top surface of substrate 10. The slope of the sidewall profile can be expressed as the ratio of width variation to depth variation of penetration dent 103. Substrate 10 has rounded surfaces between its top surface and the sidewalls of penetration dent 103. In other words, substrate 10 comprises rounded upper corners (C) between the sidewalls of penetration dent 103 and lowermost conductive patterns 230.

Vertical pattern 155 disposed between semiconductor patterns 165 and 175a and conductive patterns 230 extends to the sidewalls of penetration dent 103 to cover the rounded upper corners (C) of substrate 10. In other embodiments, as shown in FIG. 22D, an oxidation process is performed to form a silicon oxide layer between vertical pattern 155a and the sidewalls of penetration dent 103.

According to some embodiments, a dielectric layer is disposed between the bottom surface of lowermost conductive pattern 230 and the top surface of substrate 10. The dielectric layer comprises a first portion close to semiconductor patterns 165 and 175a, and a second portion spaced apart from semiconductor patterns 165 and 175a. The first portion of the dielectric layer is a portion of vertical pattern 155a, and the second portion of the dielectric layer is a portion of lowermost insulation layer 120. Because substrate 10 has rounded upper corners (C) close to semiconductor patterns 165 and 175a, the first portion of the dielectric layer is thicker than the second portion of the dielectric layer. In other words, the thickness of the dielectric layer measured between the bottom surface of lowermost conductive pattern 230 and the top surface of substrate 10 is increased as it approaches the semiconductor layers 165 and 175.

In the fourth embodiment, semiconductor patterns 165 and 175a comprise penetration portions inserted in vertical pattern 155, and insertion portions extending from the penetration portions to make direct contact with substrate 10 and having a width greater than that of the penetration portions. The penetration portions of semiconductor patterns 165 and 175a are parts of semiconductor spacer 165 and second semiconductor layer 175a. The insertion portions of semiconductor patterns 165 and 175a are a part of second semiconductor layer 175a inserted in penetration dent 103 of substrate 10 and being in direct contact with substrate 10. The bottom surface of the vertical pattern 155 is in contact with the insertion portions of semiconductor patterns 165 and 175a.

In the fourth embodiment, second semiconductor layer 175a is closer to lowermost conductive pattern 230 as compared with semiconductor layer 170 of the first embodiment. This may shorten a current path from a common source line CSL (refer to FIG. 1) to a bit line BL (refer to FIG. 1) in substrate 10 and semiconductor patterns 165 and 175a.

FIGS. 23A through 23E are sectional views for explaining a method of manufacturing a three-dimensional semiconductor memory device according to a fifth embodiment of the inventive concept. FIGS. 23A through 23E illustrate a lower region of the three-dimensional semiconductor memory device of the fifth embodiment. Many features shown in FIGS. 23A through 23E are the same as features described above, so a further description of these features may be omitted for the sake of brevity.

Figure 23A:
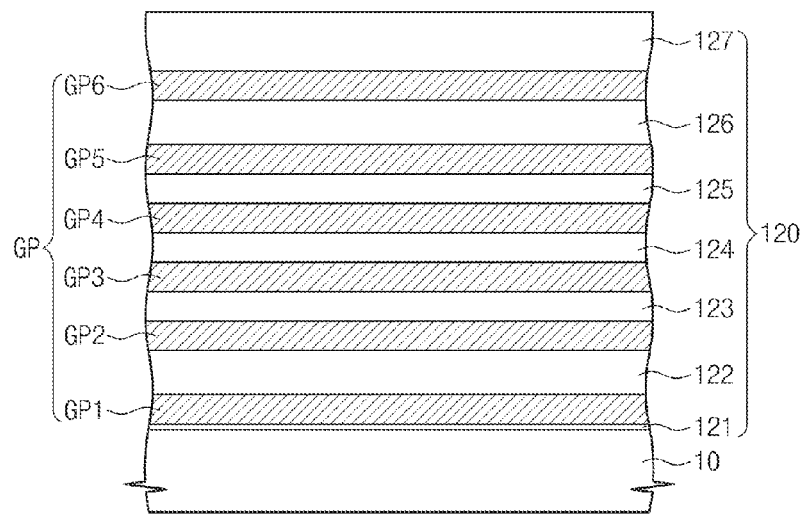
FIGS. 23A through 23E are perspective views for explaining a method of manufacturing a three-dimensional semiconductor memory device according to a fifth embodiment of the inventive concept.

Referring to FIG. 23A, a mold structure 100 in which gate conductive layers GP (GP1 to GP6) and insulation layers 120 (121 through 127) are alternately stacked is formed on substrate 10. In this embodiment, an impurity region (not shown) is formed in substrate 10 as a common source line CSL (refer to FIG. 1), and mold structure 100 is disposed on the impurity region.

Insulation layers 120 (121 through 127) typically comprise thermal oxide layers, silicon oxide layers, or silicon oxynitride layers. The lower most insulation layer 121 is formed of a dielectric material such as a thermal oxide that has an etch selectivity with respect to the gate conductive layers GP (GP1 through GP6).

Gate conductive layers GP (GP1 through GP6) typically comprise conductive materials to be used as gate electrodes. For example, gate conductive layers GP (GP1 through GP6) can comprise at least one of doped polysilicon, metal materials, metal nitrides, and metal silicides.

The lowermost gate conductive layer GP1 of mold structure 100 is used as a ground select line GSL explained with reference to FIG. 1, and the uppermost gate conductive layer GP6 is used as a string selection line SSL explained with reference to FIG. 1. Other gate conductive layers GP2 through GP4 are used as word lines WL explained with reference to FIG. 1.

In certain embodiments, gate conductive layers GP3 through GP6 are used as gate electrodes of memory cell transistors, and the thickness of gate conductive layers GP3 through GP6 determines the channel length of the memory cell transistors. In some embodiments, gate conductive layers GP (GP1 through GP6) are formed through a deposition process, so the channel length can be adjusted more precisely than with patterning technology. In addition, because the channel length direction of the memory cell transistors is perpendicular to substrate 10, the integration level of the three-dimensional semiconductor memory device of this embodiment is independent of the thickness of gate conductive layers GP (GP1 through GP6). In addition, as described above, the distance between gate conductive layers GP (GP1 through GP6) used as gate electrodes of memory cell transistors (that is, the thickness of insulation layers 120 (121 through 127) is smaller than the maximum width of an inversion region of a semiconductor pattern formed in a subsequent process.

Ground select line GSL and string selection line SSL explained with reference to FIG. 1 are formed by vertically neighboring gate conductive layers. In some embodiments, the lowermost and uppermost gate conductive layers GP1 and GP6 used as ground select line GSL and string selection line SSL are thicker than other gate conductive layers GP2 through GP5.

The properties of the thin layers of mold structure 100 such as the number, thicknesses, and materials of thin layers may be variously changed according to electrode characteristics of memory cell transistors and technical difficulty of patterning processes.

Figure 23B:
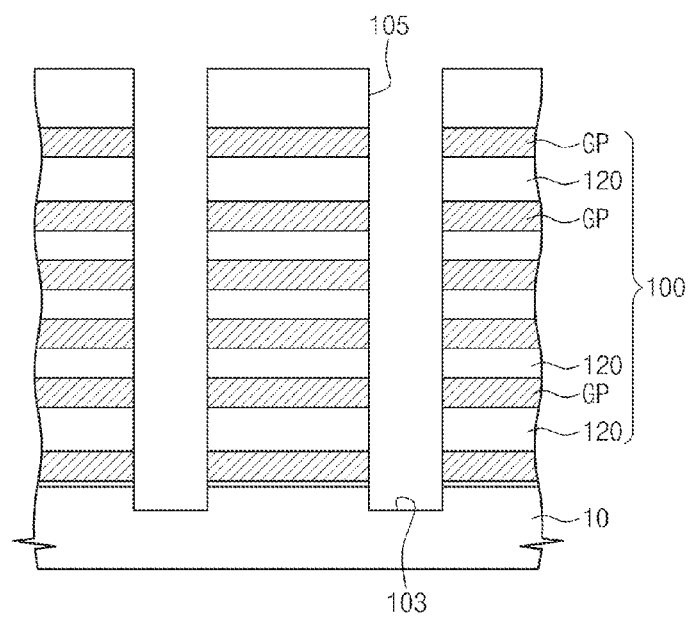

Referring to FIG. 23B, mold structure 100 is patterned to form openings 105 through which substrate 10 is exposed. The forming of openings 105 typically comprises forming a mask pattern (not shown) on mold structure 100 to define planar positions of openings 105, and anisotropically etching mold structure 100 by using the mask pattern as an etch mask.

As described with reference to FIG. 3, gate conductive layers GP and insulation layers 120 are exposed through openings 105. Openings 105 can have a cylindrical hole shape or a rectangular parallelepiped hole shape, and they may form a two-dimensionally regular arrangement. The width of openings 105 can be varied according to the distance from substrate 10 as a result of the anisotropic etching process. As described above, openings 105 may have a line or rectangular shape. The top surface of substrate 10 can be exposed through openings 105.

In addition, due to over-etch during the forming of openings 105, the top surface of substrate 10 exposed through openings 105 may be recessed. As a result, as shown in FIG. 23B, penetration dents 103 having sidewalls and bottom surfaces may be formed in substrate 10.

Next, as described with reference to FIG. 20B, rounded profiles are formed between the sidewalls of penetration dents 103 and the top surface of substrate 10. That is, upper corners (C) of substrate 10 may be rounded. In some embodiments, an oxidation process is performed to round the upper corners (C) of substrate 10 by oxidizing substrate 10 exposed through openings 105. The oxidation process typically comprises a thermal oxidation process or a radical oxidation process.

Figure 23C:
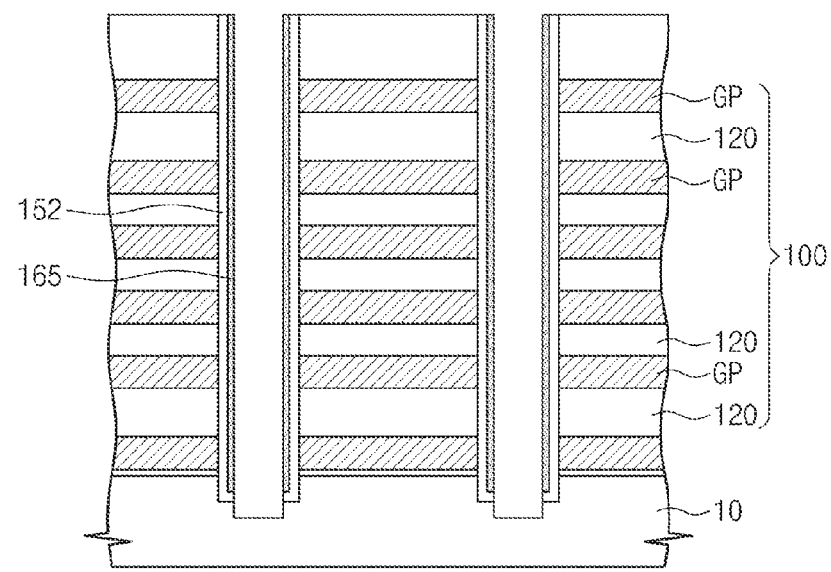

Referring to FIG. 23C, data storage patterns 152 and semiconductor spacers 165 are sequentially formed to cover the inner walls of openings 105.

The forming of the data storage patterns 152 and semiconductor spacers 165 typically comprises forming the data storage patterns 152 uniformly on the inner walls of openings 105, forming first semiconductor layers uniformly on the data storage patterns 152, and anisotropically etching the first semiconductor layers and the data storage patterns 152 to expose the top surface substrate 10 at the bottoms sides of openings 105.

In some embodiments, before forming data storage patterns 152, silicon oxide layers formed on penetration dents 103 are removed. After the silicon oxide layers are removed, the rounded upper corners (C) of substrate 10 are exposed, and the sidewalls and bottom surfaces of penetration dents 103 are exposed. The upper corners (C) of substrate 10 are disposed under mold structure 100, and a gap region is formed between the rounded upper corners (C) of substrate 10 and mold structure 100.

Data storage patterns 152 can be formed by deposition technology, such as CVD or ALD, for good step coverage, and the thickness of data storage layers 152 can be less than half the width of openings 105. Consequently, sidewalls of the gate conductive layers GP and insulation layers 120 exposed through openings 105 can be uniformly covered with data storage layers 152. In addition, because data storage layers 152 are formed using deposition technology, data storage layers 152 can be uniformly formed on portions of the top surface of substrate 10 exposed through openings 105. In some embodiments, the gap region between mold structure 100 and the rounded upper corners (C) of substrate 10 is filled with data storage layers 152 as shown in FIG. 23E.

Each of data storage layers 152 can be formed of a thin layer or a plurality of thin layers. For example, data storage layers 152 can comprise at least one thin layer used as a memory element of a charge trap nonvolatile memory transistor. For example, data storage layers 152 can comprise insulation layers including trap insulation layers, floating gate electrodes, or conductive nanodots.

In some embodiments, as described with reference to FIGS. 17A through 17H, data storage layers 152 comprise a blocking insulation layer, a charge trap layer, and a tunnel insulation layer that are sequentially stacked. The blocking insulation layer may make contact with insulation layers 120 and gate conductive layers GP. The blocking insulation layer typically comprises at least one of a silicon oxide layer, a silicon nitride layer, a silicon oxynitride layer, and a high dielectric constant layer. The blocking insulation layer can be composed of a plurality of layers.

The high dielectric layer is an insulation layer having a dielectric constant greater than that of a silicon oxide layer. Examples of the high dielectric layer include a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a barium strontium titanate (BST) layer, and a lead zirconate titanate (PZT) layer.

The tunnel insulation layer is typically formed of a material having a dielectric constant less than that of the blocking insulation layer. The charge trap layer can be an insulation thin layer (such as a silicon nitride layer) having many charge trap sites or an insulation thin layer having conductive grains. In some embodiments, the tunnel insulation layer may be a silicon oxide layer, the charge trap layer may be a silicon nitride layer, and the blocking insulation layer may be an insulation layer including an aluminum oxide layer.

Data storage patterns 152 and semiconductor spacers 165 are formed into a cylindrical shape having open sides. Furthermore, as a result of over-etch during the anisotropic etching process of the first semiconductor layers, the bottom surfaces of penetration dents 103 exposed through semiconductor spacers 165 may be recessed.

During the anisotropic etching process, portions of data storage layers 152 disposed at lower sides of semiconductor spacers 165 may not be etched. In this case, data storage layers 152 may include bottom portions disposed between the bottom surfaces of semiconductor spacers 165 and the top surface of substrate 10.

Referring to FIG. 23E, a second semiconductor layer 170 (refer to FIG. 7) is formed in opening 105 where data storage pattern 152 and semiconductor spacer 165 are formed, so as to form semiconductor body 175 being in contact with substrate 10.

Second semiconductor layer 170 is typically formed by a deposition technique exhibiting good step coverage. Second semiconductor layer 170 is generally deposited to a thickness less than or equal to half the width of opening 105. Opening 105 is partially filled with second semiconductor layer 170, and an empty region is formed in a center region of opening 105. Second semiconductor layer 170 is typically formed into a hollow cylinder shape or a shell shape. In addition, the thickness of second semiconductor layer 170 (i.e., a shell thickness) is smaller than the width of a depletion region or the average length of silicon grains of polycrystalline silicon. The empty region defined by second semiconductor layer 170 is filled with a buried insulation pattern 185. In some embodiments, as described with reference to FIG. 15, second semiconductor layer 170 is completely filled in opening 105 through a deposition process.

Figure 23D:
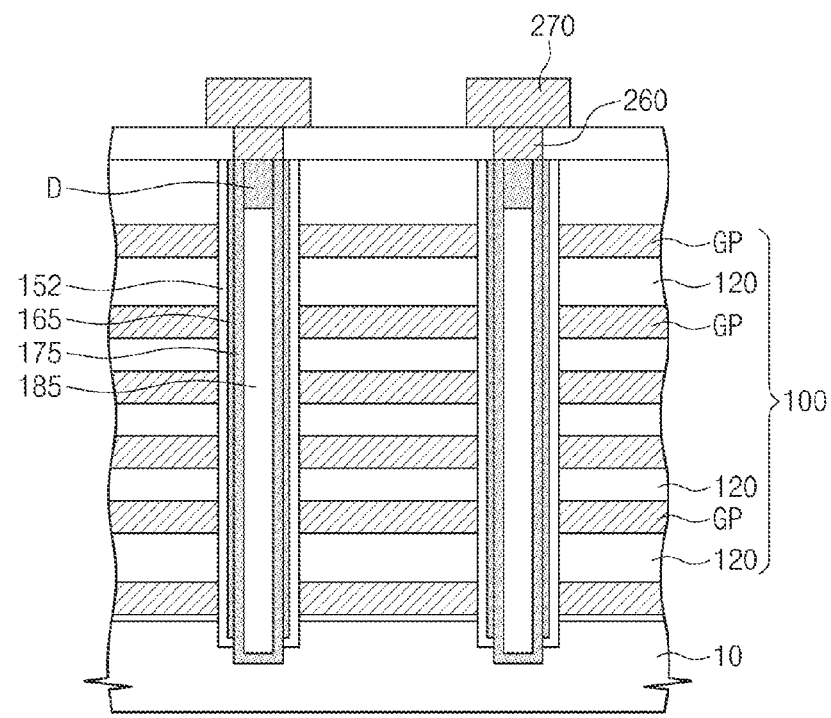
Figure 23E:
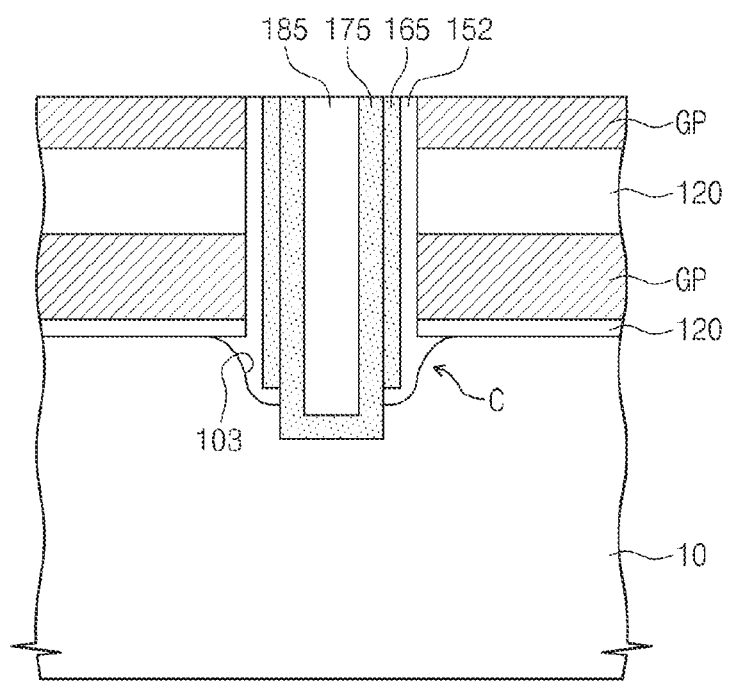

As shown in FIG. 23D, upper plugs 260 can be formed on top sides of second semiconductor body 175, and upper interconnections 270 may be formed on top sides of the upper plugs 260 to connect upper plugs 260.

In some embodiments, impurity regions (D) are formed on top sides of semiconductor spacers 165 and semiconductor body portion 175. The impurity regions (D) can be doped with a conductive type different from that of parts of semiconductor spacers 165 disposed under the impurity regions (D). Accordingly, the impurity regions (D) can form diodes together with their lower regions. In some embodiments, upper plugs 260 are formed of doped silicon or a metal material. Upper plugs 260 can also be formed of a silicon layer doped with a conductive type different from that of semiconductor spacers 165 and semiconductor body portion 175. In this case, upper plugs 260 may form PN junctions together with semiconductor spacers 165 and semiconductor body portion 175.

Each of upper interconnections 270 can be electrically connected to semiconductor spacers 165 and semiconductor body portion 175 through upper plugs 260. Upper interconnections 270 can be arranged across horizontal structures HS. In embodiments forming a NAND flash memory, upper interconnections 270 are used as bit lines connected to a plurality of cell strings.

In some embodiments, as described above, trenches are formed between neighboring semiconductor body portions 175. As a result, mold structure 100 composed of gate conductive layers GP and insulation layers 120 have parallel lines. A plurality of semiconductor body portions 175 can penetrate one line of mold structure 100.

Unlike the first and second embodiments, in the fifth embodiment, insulation layers 120 and gate conductive layers GP of the three-dimensional semiconductor memory device are in contact with each other as shown in FIGS. 23D and 23E. In addition, referring to FIG. 23E, penetration dents 103 having sidewalls and bottom surfaces are formed in predetermined regions of substrate 10. As described above, the upper width of penetration dent 103 formed in substrate 10 is greater than the width of semiconductor patterns 165 and 175. The width of penetration dent 103 is monotonically decreased as it goes downward. The slope of the sidewall profile of penetration dent 103 varies along the depth of penetration dent 103. For example, the same slope may be measured at different positions of the sidewall profile of penetration dent 103 from the top surface of substrate 10. The slope of the sidewall profile can be expressed as a ratio of width variation to depth variation of penetration dent 103. Substrate 10 can have rounded surfaces between its top surface and the sidewalls of penetration dent 103. In other words, the rounded upper corners (C) of substrate 10 can be located between the sidewalls of penetration dent 103 and the lowermost gate conductive layer GP1.

Semiconductor body 175 penetrates gate conductive layers GP stacked on substrate 10 and is inserted in penetration dent 103 of substrate 10 for direct contact with substrate 10. Data storage pattern 152 disposed between second semiconductor body 175 and gate conductive layers GP extend to the sidewall of penetration dent 103 to cover the rounded upper corners (C) of substrate 10. In other embodiments, as described above, an oxidation process is performed to form a silicon oxide layer between data storage pattern 152 and the sidewall of penetration dent 103.

Figure 24:
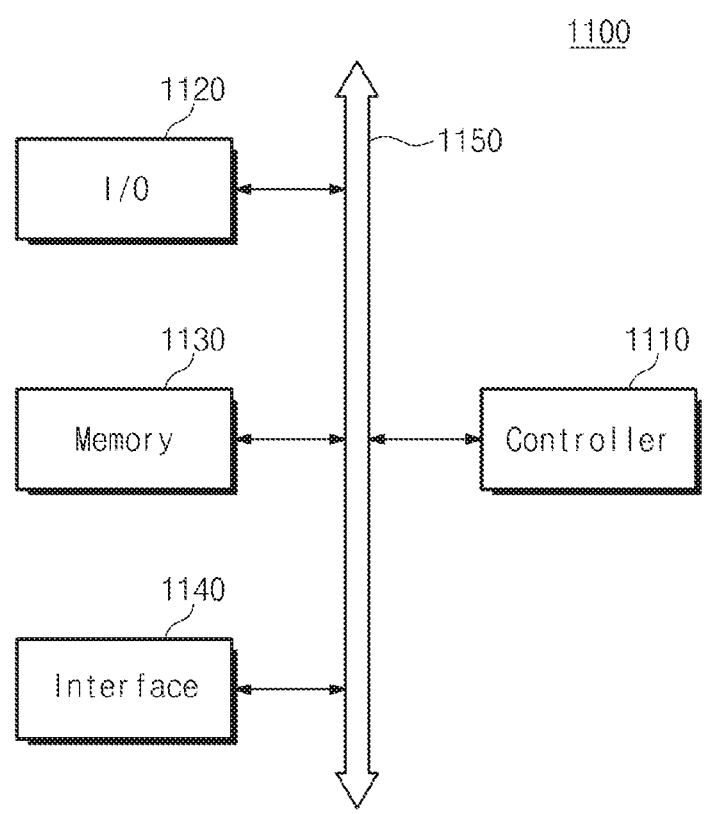
FIG. 24 is a schematic block diagram illustrating a memory system comprising a three-dimensional semiconductor memory device according to an embodiment of the inventive concept.

FIG. 24 is a schematic block diagram illustrating a memory system 1100 comprising a three-dimensional semiconductor memory device according to an embodiment of the inventive concept.

Referring to FIG. 24, memory system 1100 can be incorporated in various devices or systems, such as a personal digital assistant (PDA), a portable computer, a web tablet, a wireless phone, a mobile phone, a digital music player, a memory card, or another device capable of wirelessly receiving and transmitting data.

Memory system 1100 comprises a controller 1110, an input/output (I/O) unit 1120 such as a key board and a display device, a memory 1130, an interface 1140, and a bus 1150. Memory 1130 and the interface 1140 communicate with each other through the bus 1150.

Controller 1110 comprises at least one microprocessor, a digital signal processor, a microcontroller, or other similar processors. Memory 1130 stores commands of controller 1110. I/O unit 1120 receives or transmits data or signals between memory system 1100 and external devices. For example, the I/O unit 1120 may be connected to a key board, a key pad, or a display device. Memory 1130 comprises a nonvolatile memory device according to one of the above described embodiments. Memory 1130 can further comprise another memory, including various types of nonvolatile or volatile memories. Interface 1140 transmits and receives data to and from a communication network.

Figure 25:
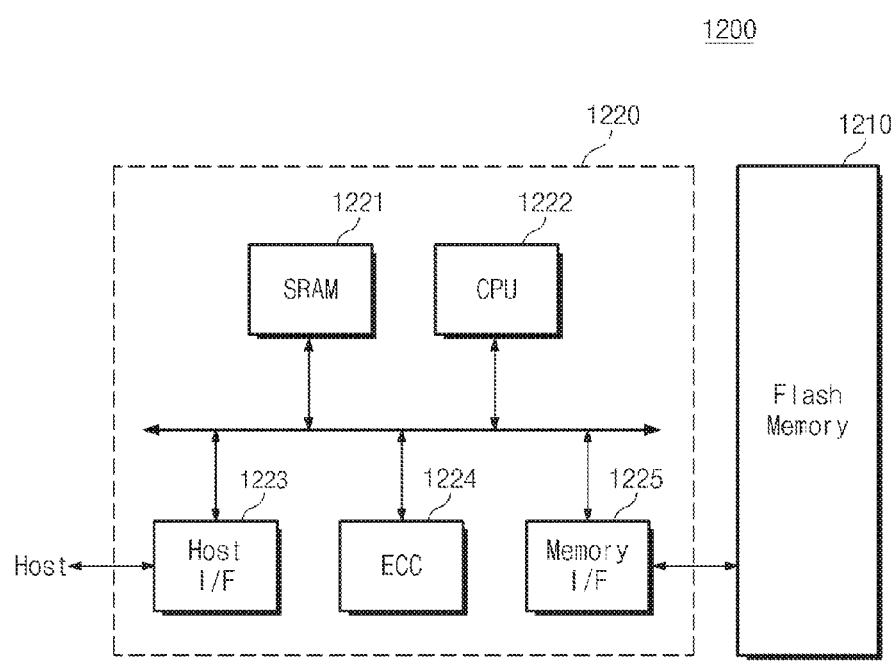
FIG. 25 is a schematic block diagram illustrating a memory card comprising a three-dimensional semiconductor memory device according to an embodiment of the inventive concept.

FIG. 25 is a schematic block diagram illustrating a memory card 1200 comprising a three-dimensional semiconductor memory device according to an embodiment of the inventive concept.

Referring to FIG. 25, memory card 1200 supports high-capacity data storage and comprises a flash memory 1210 according to one of the above-described embodiments. Memory card 1200 comprises a memory controller 1220 adapted to control overall data exchange between a host and flash memory 1210.

A static random access memory (SRAM) 1221 is used as a working memory for a central processing unit (CPU) 1222. A host interface 1223 implements a data exchange protocol of the host connected with memory card 1200. An error correction coding (ECC) block 1224 detects and corrects errors included in data read out from flash memory 1210 having multi-bit characteristics. A memory interface 1225 interfaces with flash memory 1210. CPU 1222 controls overall data exchange operations of memory controller 1220. In addition, memory card 1200 can further comprise a read only memory (ROM) (not shown) storing code data for interfacing with the host.

Figure 26:
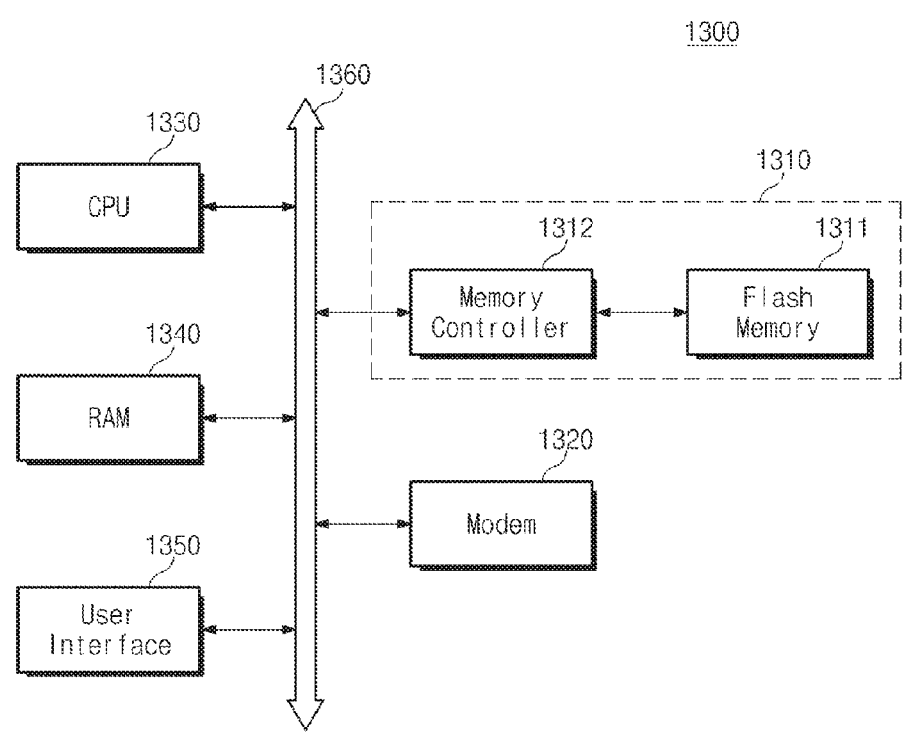
FIG. 26 is a schematic block diagram illustrating a data processing system comprising a three-dimensional semiconductor memory device according to an embodiment of the inventive concept.

FIG. 26 is a schematic block diagram illustrating a data processing system 1300 comprising a three-dimensional semiconductor memory device according to an embodiment of the inventive concept.

Referring to FIG. 26, data processing system 1300 can be a mobile device or a desk top computer, and a flash memory system 1310 is included in the data processing system 1300. Data processing system 1300 comprises flash memory system 1310, a modem 1320, a CPU 1330, a RAM 1340, and a user interface 1350 that are connected to each other through a system bus 1360. Flash memory system 1310 is substantially the same as the above-described memory system or flash memory system. Flash memory system 1310 stores data processed by CPU 1330 or input from an outside device. Flash memory system 1310 can take the form of storage device such as a solid state drive (SSD). In this case, data processing system 1300 stores a large amount of data stably in the flash memory system 1310. Because flash memory system 1310 is highly reliable, resources required for error correction may be reduced, and thus flash memory system 1310 may provide a high-speed data exchange function to data processing system 1300. In certain embodiments, data processing system 1300 may further comprise another device such as an application chipset, a camera image processor (CIS), and an I/O device.

The above-described memory devices and memory systems can be mounted in various types of packages or package configurations. For example, they can be formed in packages or package configurations such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, in certain embodiments of the inventive concept, a lower oxide layer is formed on a side of a vertical pattern (i.e., data storage layer) inserted in a top surface of a substrate by a predetermined depth. This prevents an inversion region formed in the substrate from being reduced by a voltage applied to a lowermost conductive pattern, and it prevents a current path formed in a body of a semiconductor layer or the substrate from being cut off by a voltage applied to the lowermost conductive pattern.

In certain embodiments, because a substrate is rounded at its upper corners disposed between sidewalls of a vertical pattern inserted in a penetration dent of the substrate and the bottom surface of the lowermost conductive pattern, a thick dielectric layer is formed between sidewalls of the vertical pattern inserted in the penetration dent of the substrate and the bottom surface of the lowermost conductive pattern. This prevents weakening of an electric field applied from the lowermost conductive pattern to the lower region of a semiconductor pattern. Therefore, where the semiconductor memory device is operated, an inversion region formed in the substrate and the semiconductor pattern is not cut off.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a three-dimensional semiconductor memory device, comprising:
    forming a thin layer structure by alternately forming first and second material layers one on another on a substrate comprising semiconductor material;
    forming an opening through the thin layer structure and forming an indentation, contiguous with the opening, in a top surface of the semiconductor material of the substrate;
    forming an oxide layer between the thin layer structure and the substrate by oxidizing a surface of the semiconductor material of the substrate delimiting a side of the indentation such that a rounded boundary exists between the oxide layer and the substrate directly beneath the thin layer structure;
    forming a vertical insulation layer extending through the thin layer structure within the opening and into the indentation so as to extend over a surface defining a side of the indentation; and
    forming a semiconductor pattern on the vertical insulation layer in the opening and extending into the indentation of the substrate and beyond the vertical insulation layer.

2. The method of claim 1, wherein forming the vertical insulation layer comprises an upper region in contact with a surface of the thin layer structure that delimits the opening and a lower region extending into the indentation, and
    wherein the vertical insulation layer and the oxide layer are formed such that the oxide layer is in contact with the lower region of the vertical insulation layer.

3. The method of claim 2, wherein a vertical thickness of the oxide layer is greater than a horizontal thickness of the vertical insulation layer.

4. The method of claim 2, wherein a vertical thickness of the oxide layer increases as the oxide layer becomes closer to the semiconductor pattern.

5. The method of claim 1, wherein the alternate forming of the first and second material layers is carried out until the thin layer structure comprises a plurality of the first material layers and a plurality of the second material layers such that a respective one of the second material layers is interposed between vertically adjacent ones of each respective pair of the first material layers, and
wherein after forming the semiconductor pattern, the method further comprises:
forming a trench spaced apart from the semiconductor pattern and exposing the substrate by patterning the thin layer structure;
forming recesses between the first material layers by removing the second material layers exposed through the trench; and
sequentially forming a horizontal insulation layer and conductive pattern in each of the recesses.

6. The method of claim 5, wherein the oxide layer is formed before forming the horizontal insulation layers and the conductive patterns.

7. The method of claim 1, wherein the oxide layer is formed before forming the vertical insulation layer.

8. The method of claim 1, wherein forming the semiconductor pattern comprises:
forming a first semiconductor layer on the vertical insulation layer;
removing the vertical insulation layer and the first semiconductor layer locally from a bottom portion of the indentation; and
forming a second semiconductor layer connecting the substrate to the first semiconductor layer.

9. The method of claim 8, wherein before forming the second semiconductor layer, the method further comprises:
exposing a surface delimiting the bottom portion of the indentation by the locally removing of the vertical insulation layer from the bottom portion of the indentation; and
wherein the locally removing forms an undercut through which a bottom surface of the first semiconductor layer is exposed by isotropically etching the vertical insulation layer and the first semiconductor layer.

10. The method of claim 1, wherein the oxide layer and the vertical insulation layer are formed such that the oxide layer extends along a side of the vertical insulation layer in the indentation.

11. The method of claim 1, and further comprising forming a region of impurities in the substrate at such a location that the oxide layer is interposed between the semiconductor pattern and the region of impurities.

12. A method of manufacturing a three-dimensional semiconductor memory device, comprising:
forming a thin layer structure by alternately stacking first and second material layers on a substrate;
forming an opening through the thin layer structure and forming an indentation, contiguous with the opening, in a top surface of the substrate;
forming an oxide layer between the thin layer structure and the substrate by oxidizing a surface of the substrate delimiting a side of the indentation;
forming a vertical insulation layer extending through the thin layer structure within the opening; and
forming a first semiconductor layer on the vertical insulation layer, removing the vertical insulation layer and the first semiconductor layer locally from a bottom portion of the indentation, exposing a surface delimiting the bottom portion of the indentation by the locally removing of the vertical insulation layer from the bottom portion of the indentation, wherein the locally removing forms an undercut through which a bottom surface of the first semiconductor layer is exposed by isotropically etching the vertical insulation layer and the first semiconductor layer, and forming a second semiconductor layer connecting the substrate to the first semiconductor layer to form a semiconductor pattern on the vertical insulation layer in the opening and extending into the substrate.

13. The method of claim 12, wherein the vertical insulation layer is formed to extend into the indentation over a surface defining a side of the indentation, and
the oxide layer and the vertical insulation layer are formed such that the oxide layer extends along a side of the vertical insulation layer in the indentation.

14. The method of claim 12, and further comprising forming a region of impurities in the substrate at such a location that the oxide layer is interposed between the semiconductor pattern and the region of impurities.

* * * * *